(12) United States Patent
Shi et al.

(10) Patent No.: US 12,411,192 B2
(45) Date of Patent: Sep. 9, 2025

(54) SPIN-BASED DETECTION OF TERAHERTZ AND SUB-TERAHERTZ ELECTROMAGNETIC RADIATION

(71) Applicant: The Regents of the University of California, Oakland, CA (US)

(72) Inventors: Jing Shi, Riverside, CA (US); Junxue Li, Riverside, CA (US)

(73) Assignee: The Regents of the University of California, Oakland, CA (US)

( * ) Notice: Subject to any disclaimer, the term of this patent is extended or adjusted under 35 U.S.C. 154(b) by 268 days.

(21) Appl. No.: 18/307,451

(22) Filed: Apr. 26, 2023

(65) Prior Publication Data

US 2023/0266413 A1  Aug. 24, 2023

Related U.S. Application Data

(63) Continuation of application No. 17/020,796, filed on Sep. 14, 2020, now Pat. No. 11,639,975.
(Continued)

(51) Int. Cl.
  *G01N 21/3586* (2014.01)
  *G01R 33/07* (2006.01)
  (Continued)

(52) U.S. Cl.
  CPC ..... *G01R 33/1284* (2013.01); *G01N 21/3586* (2013.01); *G01R 33/075* (2013.01); *H10N 50/80* (2023.02)

(58) Field of Classification Search
  CPC .. G01R 33/1284; G01R 33/075; H10N 50/80; G01N 21/3586
  See application file for complete search history.

(56) References Cited

U.S. PATENT DOCUMENTS

| | | |
|---|---|---|
| 11,639,975 B2 | 5/2023 | Shi et al. |
| 2013/0154633 A1 | 6/2013 | Fujiwara et al. |
| 2020/0225152 A1* | 7/2020 | Tankhilevich ......... B82Y 25/00 |

FOREIGN PATENT DOCUMENTS

| | | | | |
|---|---|---|---|---|
| CN | 106252503 A | * | 12/2016 | ............. H01L 43/10 |
| CN | 106896081 A | * | 6/2017 | |
| WO | WO-2018017018 A1 | * | 1/2018 | ......... G01N 21/3586 |

OTHER PUBLICATIONS

Baltz, V. et al. "Antiferromagnetic spintronics." *Rev. Mod. Phys.* 90,015005, 2018.
(Continued)

*Primary Examiner* — David P Porta
*Assistant Examiner* — Fani Polyzos Boosalis
(74) *Attorney, Agent, or Firm* — Mintz Levin Cohn Ferris Glovsky and Popeo, P.C.

(57) ABSTRACT

Systems and methods for spin-based detection of electromagnetic radiation at terahertz and sub-terahertz frequencies is provided. The detector can include a heterostructure and an electrical circuit. The heterostructure can include a first layer formed of an antiferromagnetic material (AFM) in contact with a second layer of a heavy metal (HM) and a third layer. The third layer can generate an effective field oriented approximately parallel to an easy axis of the first layer and approximately parallel to a propagation direction of electromagnetic radiation. The circuit can be in electrical communication with the second layer. The first layer can inject a spin current into the second layer in response to receipt of electromagnetic radiation having a sub-terahertz or terahertz frequency. The second layer can convert the injected spin current into a potential difference. The circuit can be configured to output a signal corresponding to the potential difference.

20 Claims, 27 Drawing Sheets

Related U.S. Application Data

(60) Provisional application No. 62/925,427, filed on Oct. 24, 2019, provisional application No. 62/914,794, filed on Oct. 14, 2019.

(51) Int. Cl.
   *G01R 33/12* (2006.01)
   *H10N 50/80* (2023.01)

(56) References Cited

OTHER PUBLICATIONS

Bogdanov, A. N. et al. "Spin-flop transition in uniaxial antiferromagnets: magnetic phases, reorientation effects, and multidomain states," *Phys. Rev. B* 75, 094425, 2007.
Chen, Y. S. et al. "Incoherent spin pumping from YIG single crystals," *Phys. Rev. B* 99, 220402(R), 2019.
Cheng, R. et al. "Spin pumping and spin-transfer torques in antiferromagnets," *Phys. Rev. Lett.* 113, 057601, 2014.
Cramer, J. et al. "Magnon mode selective spin transport in compensated ferrimagnets," *Nano Lett.* 17(6):3334-3340, 2017.
Dayhoff, E. S. "Antiferromagnetic Resonance in Cr2O3," *Phys. Rev.* 107, 84, 1957.
Edwards, D. T. et al. "Phase cycling with a 240 GHz, free electron laser-powered electron paramagnetic resonance spectrometer," *Phys. Chem. Chem. Phys.* 15(15):5707-5719 (2013).
Foner, S. "High-field antiferromagnetic resonance in Cr2O3," *Phys. Rev.* 130:183-197 (1963).
Geprags, S. et al. "Origin of the spin Seebeck effect in compensated ferrimagnets," *Nat. Commun.* 7:10452 (2016).
Gomonay, O. et al. "Antiferromagnetic spin textures and dynamics," *Nat. Phys.* 14(3):213-216 (2018).
He, X. et al. Robust isothermal electric control of exchange bias at room temperature. *Nature Mater* 9(7):579-585 (2010).
Hoffmann, A. "Spin Hall effects in metals," *IEEE Trans. Magn.* 49(10):5172-5193 (2013).
Johansen, O. et al. "Spin pumping and inverse spin Hall voltages from dynamical antiferromagnets," Phys. Rev. B 95, 220408(R) (2017).

Kampfrath, T. et al. "Coherent terahertz control of antiferromagnetic spin waves," *Nat. Photon.* 5, 31-34 (2011).
Keffer, F. et al. "Theory of antiferromagnetic resonance," *Phys. Rev.* 85, 329-337 (1952).
Kittel, C. "Theory of antiferromagnetic resonance," *Phys. Rev.* 82, 565 (1951).
Kriegner, D. et al. "Multiple-stable anisotropic magnetoresistance memory in antiferromagnetic MnTe," *Nat. Commun.* 7:11623 (2016).
Li, J. et al. "Observation of magnon-mediated current drag in Pt/yttrium iron garnet/Pt(Ta) trilayers," *Nat. Commun.* 7:10858 (2016).
Li, J. et al. "Spin Seebeck Effect from Antiferromagnetic Magnons and Critical Spin Fluctuations in Epitaxial $FeF_2$ Films," *Phys. Rev. Lett.* 122 (21):217204 (2019).
Lin, W.W. et al. "Evidence of pure spin current," arXiv:1804.01392 (2018).
Marti, X. et al. "Room-temperature antiferromagnetic memory resistor," *Nat. Mater.* 13(4):367-374 (2014).
Nemec, P. et al. "Antiferromagnetic opto-spintronics," *Nat. Phys.* 14:229-241 (2018).
Rezende, S.M. et al. "Theory of the spin Seebeck effect in antiferromagnets," Phys. Rev. B 93, 014425 (2016).
Ross, P. et al. "Antiferromagentic resonance detected by direct current voltages in MnF2/Pt bilayers" *J. Appl. Phys.* 118, 233907 (2015).
Seki, S. et al. "Thermal generation of spin current in an antiferromagnet," *Phys. Rev. Lett.* 115(26):266601 (2015).
Sinova, J. et al. "Spin Hall effects," *Rev. Mod. Phys.* 87, 1213-1259 (2015).
Takahashi, S. et al. "Pulsed electron paramagnetic resonance spectroscopy powered by a free-electron laser," *Nature* (London) 489(7416):409-413 (2012).
Tzschaschel, C. et al. "Ultrafast optical excitation of coherent magnons in antiferromagnetic NiO," *Phys. Rev. B* 95, 174407 (2017).
Wadley, P. et al. "Electrical switching of an antiferromagnet," *Science* 351(6273):587-590 (2016).
Wu, S. M. et al. "Antiferromagnetic spin Seebeck effect," *Phys. Rev. Lett.* 116(9):097204 (2016).

\* cited by examiner

FIG. 1D  FIG. 1E

SPIN-BASED DETECTION OF TERAHERTZ AND SUB-TERAHERTZ ELECTROMAGNETIC RADIATION

CROSS-REFERENCE TO RELATED APPLICATIONS

This application is a continuation of U.S. patent application Ser. No. 17/020,796, filed on Sep. 14, 2020, which claims the benefit of priority of U.S. Provisional Patent Application No. 62/914,794, filed Oct. 14, 2019, entitled "Spin Current From Anti-Ferromagnetic Magnons Generated By Sub-Terahertz Radiation," and U.S. Provisional Patent Application No. 62/925,427, filed Oct. 24, 2019 entitled "Spin Current From Anti-Ferromagnetic Magnons Generated By Sub-Terahertz Radiation." The entirety of each of these applications is incorporated by reference.

STATEMENT OF GOVERNMENT SUPPORT

This invention is made with government support under Contract No. DE-SC0012670 awarded by the U.S. Department of Energy. The government has certain rights in the invention.

BACKGROUND

Angular momentum is a fundamental property of motion. For elementary particles such as electrons, the total angular momentum is given by the sum of orbital angular momentum and spin angular momentum. Orbital angular momentum arises from the orbit of the electron about a nucleus. Spin angular momentum, also referred to as spin, is the remaining angular momentum of the electron not associated with orbital motion of the electron. Spin can be likened to a vector quantity, with a direction and a quantized magnitude given by n/2, where n is a non-negative integer.

Spintronics is the study of the spin of electrons and its associated magnetic moment in solid state devices, amongst other properties, and involves manipulation of spins by magnetic and electrical fields. Spin current, the flow of spins, is an area of active investigation in spintronics. There exists an ongoing need for improved systems and methods for generation and detection of spin current in solid state devices.

SUMMARY

Spin dynamics in antiferromagnets occurs at a much shorter time scale than in ferromagnets, which offers attractive benefits for potential ultrafast device applications (see references 1-3). To date, spin current generation via antiferromagnetic resonance and simultaneous electrical detection by the inverse spin Hall effect in heavy metals have not been explicitly demonstrated (see references 4-6).

Embodiments of the present disclosure provide systems and methods configured to generate pure spin current in response to receipt of electromagnetic radiation (e.g., radiation having frequencies on the order of terahertz or sub-terahertz or wavelengths on the order of mm or sub-mm (e.g., microwaves). As discussed in greater detail below, the system includes a heterostructure formed from thin films or layers of an antiferromagnetic (AFM) material and a heavy metal possessing strong spin-orbit coupling (e.g., metals having a spin Hall angle greater than or equal to about 0.10). The system can optionally include a waveguide configured to direct electromagnetic radiation incident upon the AFM material. In certain embodiments, the system can include a magnetic field generator configured to generate a magnetic field having a direction oriented approximately parallel to the easy axis of the AFM crystal lattice and the direction of electromagnetic radiation propagation. For AFM materials, the easy axis can be the direction that spins in two sub-lattices (or sub-lattice magnetizations) prefer in a zero magnetic field. In embodiments where the terahertz or sub-terahertz radiation possesses circular or elliptical polarization, the magnetic field generator can be omitted.

Pure spin current is generated by interaction of the electromagnetic radiation with the AFM/heavy metal heterostructure. The spin current is generated within the AFM layer and flows from the AFM layer to the HM layer, producing an electrical charge current within the HM layer through the inverse spin Hall Effect (ISHE). That is to say, the AFM layer function as a spin current source and the HM layer functions as a drain for the spin current. In this draining process, the spin current can be converted to an electrical current or open circuit voltage. The system can further include a circuit configured to output an electrical signal that corresponds to the electrical current or open circuit voltage. The output electrical signal can be calibrated so as to represent characteristics of the terahertz or sub-terahertz radiation (e.g., amplitude). In this manner, the system can function as a spin-based sub-terahertz/terahertz radiation detector.

As noted above, the generated spin current can be converted to electrical current or an open circuit voltage by the inverse spin Hall Effect (ISHE). The inverse spin Hall Effect is an interface effect which occurs within a short distance within the second layer (e.g., HM or topological insulator), referred to as the spin diffusion length. In alternative embodiments, however, the ISHE can occur in the bulk, depending on how the spin current is injected. That is to say, it requires a spin current to flow across the interface (e.g., the interface between the first layer and the second layer). As a result, the detector can be made using thin layers, which can reduce the size of the detector. In certain embodiments, the first layers formed from an AFM material can have a thickness within the range from about 10 nm to about 100 nm. When formed from a heavy metal material, the second layer can have a thickness within the range from about 2 nm to about 10 nm. When formed from a topological insulator, the second layer can have a thickness within the range from about 5 nm to about 10 nm. If the second layer is significantly greater than the maximum thickness indicated above, the remainder of the second material distanced from the interface does not provide ISHE emf and can reduce the total signal size. If the thickness of the second layer is significantly less than the minimum thickness discussed above, it can be difficult to form a continuous film, depending on the smoothness of the underlying substrate and method of deposition. This thin film approach is fundamentally different from other techniques for detection of terahertz and sub-terahertz radiation, such as inductive and absorption detection that depend on the total magnetic volume. The ability to employ thin films provides a variety of advantages, including but not limited to, miniaturization, easy integration with other planar devices, and reduced cost to manufacture (e.g., because less material is required and/or compatibility with lithographic fabrication techniques).

In one embodiment, sub-terahertz spin pumping has been demonstrated in heterostructures of a uniaxial antiferromagnetic $Cr_2O_3$ crystal and a heavy metal of Pt or Ta (b-phase). At about 0.240 THz, the antiferromagnetic resonance in $Cr_2O_3$ occurs at approximately 2.7 T, which only excites the right-handed magnons (the quanta of spin precession). In the spin canting state, another resonance occurs at about 10.5 T from the precession of induced magnetic moments. Both resonances generate pure spin currents in the heterostructures, which can be detected by the heavy metal as an open-circuit voltage peak or dip.

The pure spin current nature of the electrically detected signals can be unambiguously confirmed by the reversal of voltage polarity under two circumstances: one when switching the detector metal from Pt to Ta which reverses the sign of spin Hall angle (7-9), and the other when flipping the magnetic field direction which reverses the magnon chirality (4-5). Without being bound by theory, the temperature dependence of the electrical signals at both resonances suggests that the spin current contains both coherent and incoherent magnon contributions, which can be further confirmed by the spin Seebeck effect measurements and well-described by a phenomenological theory. These findings reveal unique characteristics of the magnon excitations in antiferromagnets and their distinctive roles in spin-charge conversion in the high frequency regime.

In an embodiment, an electromagnetic radiation detector is provided and includes a heterostructure, a magnetic field generator, and an electrical circuit. The heterostructure can include a first layer including an antiferromagnetic material (AFM) in contact with a second layer including a heavy metal (HM) or a topological insulator. The magnetic field generator can be configured to generate a magnetic field having a direction oriented approximately parallel to an easy axis of the crystal lattice of the first layer and a direction of propagation of incident electromagnetic radiation. The electrical circuit can be in electrical communication with the second layer. The first layer can be configured to inject a spin current into the second layer in response to receipt of electromagnetic radiation having a frequency within the range of sub-terahertz or terahertz frequencies. The second layer can be configured to generate a potential difference in response to receipt of the spin current. The circuit can be configured to output an electrical signal corresponding to the potential difference.

In another embodiment, the electromagnetic radiation can have a frequency within the range from about 100 GHz to about 10 THz.

In another embodiment, the material forming the first layer can be one of MnO, $\alpha$-$Fe_2O_3$, MnS, CrSe, FeS, MnTe, $RbMnTe_2$, $MnF_2$, $NiF_2$, $CoF_2$, $FeF_2$, $FeCl_2$, $FeI_2$, FeO, FeOCl, $CoCl_2$, $CrCl_2$, CoO, $NiCl_2$, $NiI_2$, NiO, Cr, $Cr_2O_3$, $LaMnO_3$, or $Nd_5Ge_3$.

In another embodiment, the material second layer can be a heavy metal including one of Pt, W, Bi, Ta, or a AuPt alloy.

In another embodiment, the material forming the second layer can have a spin Hall angle greater than or equal to 0.1.

In another embodiment, the thickness of the first layer can be within the range of about 10 nm to about 100 nm.

In another embodiment, the thickness of the second layer can be within the range of about 2 nm to about 10 nm.

In another embodiment, the magnetic field generator can be a ferromagnetic layer. The second layer can be positioned in contact with a first side of the first layer, and the ferromagnetic layer can be positioned on a second side of the first layer, opposite the second layer.

In another embodiment, an easy axis of the ferromagnetic layer can be approximately perpendicular to the plane of the ferromagnetic material.

In another embodiment, the first layer can be strained at a level that changes the frequency within the range of sub-terahertz or terahertz frequencies at which the first layer injects spin current into the second layer as compared to the first layer in an unstrained state.

In an embodiment, a method of detecting electromagnetic radiation is provided. The method can include receiving electromagnetic radiation having a frequency within the range of sub-terahertz or terahertz frequencies by a heterostructure. The heterostructure can include a first layer of an antiferromagnetic material (AFM) in contact with a second layer of a heavy metal (HM) or a topological insulator. The method can also include generating a magnetic field having a direction oriented approximately parallel to an easy axis of the crystal lattice of the first layer and a direction of propagation of the electromagnetic field. The method can further include generating, within the first layer, a spin current in response to receipt of the electromagnetic radiation. The method can additionally include receiving, by the second layer, the spin current.

The method can further include generating, within the second layer, a potential difference in response to receipt of the spin current. The method can also include outputting, by an electrical circuit in electrical communication with the second layer, an electrical signal corresponding to the potential difference.

In another embodiment, the electromagnetic radiation can have a frequency within the range from about 100 GHz to about 10 THz.

In another embodiment, the material forming the first layer can be one of MnO, $\alpha$-$Fe_2O_3$, MnS, CrSe, FeS, MnTe, $RbMnTe_2$, $MnF_2$, $NiF_2$, $CoF_2$, $FeF_2$, $FeCl_2$, $FeI_2$, FeO, FeOCl, $CoCl_2$, $CrCl_2$, CoO, $NiCl_2$, $NiI_2$, NiO, Cr, $Cr_2O_3$, $LaMnO_3$, or $Nd_5Ge_3$.

In another embodiment, the material second layer can be a heavy metal including one of Pt, W, Bi, Ta, or a AuPt alloy.

In another embodiment, the material forming the first layer can have a spin Hall angle greater than or equal to 0.1.

In another embodiment, the thickness of the first layer can be within the range of about 10 nm to about 100 nm.

In another embodiment, the thickness of the second layer can be within the range of about 2 nm to about 10 nm.

In another embodiment, the magnetic field can be generated by a ferromagnetic layer. The second layer can be positioned in contact with a first side of the first layer. The ferromagnetic layer can be positioned on a second side of the first layer, opposite the second layer.

In another embodiment, an easy axis of the ferromagnetic layer can be approximately perpendicular to the plane of the ferromagnetic material.

In another embodiment, the first layer can be strained at a level that changes the frequency within the range of sub-terahertz or terahertz frequencies at which the first layer injects spin current into the second layer as compared to the first layer in an unstrained state.

DESCRIPTION OF THE DRAWINGS

FIG. 1A-2 is a diagram illustrating another exemplary embodiment of the system including the magnetic field generator in the form of a ferromagnetic thin film;

FIG. 1A-3 is a diagram illustrating a further exemplary embodiment of the system in which the magnetic field generator is omitted and the detector receives partially or fully polarized electromagnetic radiation.

FIG. 1D is a schematic illustration of the eigenmode of RH-AFMR;

FIG. 1E is a schematic illustration of the eigenmode of LH-AFMR;

FIG. 2 presents plots of Inverse Spin Hall Effect (ISHE) signals at AFMR and QFMR; a and c show electrical voltages from Pt channel and Ta channel at AFMR at 5 K, respectively. b and d show voltages from Pt channel and Ta channel at QFMR at 5 K, respectively. e and f are voltages from the Pt-Ta hybrid channel at AFMR and QFMR on both positive and negative field sides at 10 K, respectively. The ISHE voltage is dominated by the Ta channel at low temperatures;

FIG. 3 presents plots of temperature dependence of ISHE signals. a, ISHE voltage signal at AFMR. b, ISHE voltage signal at QFMR. c, Temperature dependence of ISHE peak height $\Delta V_{ISHE}$ (as indicated in a) at AFMR (symbols) and a best fit line. d, Temperature dependence of ISHE peak height $\Delta V_{ISHE}$ (as indicated in b) and $S_1$(symbols). $S_1$ is the magnitude of the main symmetric Lorentzian function (see Item III of the Appendix). Red solid line is a best fit. Error bars in both c and d are within the symbols;

It is noted that the drawings are not necessarily to scale. The drawings are intended to depict only typical aspects of the subject matter disclosed herein, and therefore should not be considered as limiting the scope of the disclosure.

DETAILED DESCRIPTION

Owing to the sub-terahertz and terahertz (THz) spin dynamics and absence of net magnetization, antiferromagnetic (AFM) materials offer unique advantages for ultrafast and robust spin-based nanoscale device applications (10-16). A prerequisite for practical AFM-based spintronics is the generation and electrical detection of pure spin currents. It has been proposed (4-5) to generate coherent magnon spin currents by exciting uniform spin precession at the antiferromagnetic resonance (AFMR) with THz radiation. This mechanism works in the collinear AFM phase at arbitrary magnetic fields (even zero field) below the spin flop (SF) transition. DC voltages have been detected (6) at AFMR in $MnF_2$, but it was concluded that the main DC voltage was from the microwave rectification effect or heating related thermoelectric emf. However, to date, AFM spin pumping has yet to be experimentally established.

Figures 1, 1A:
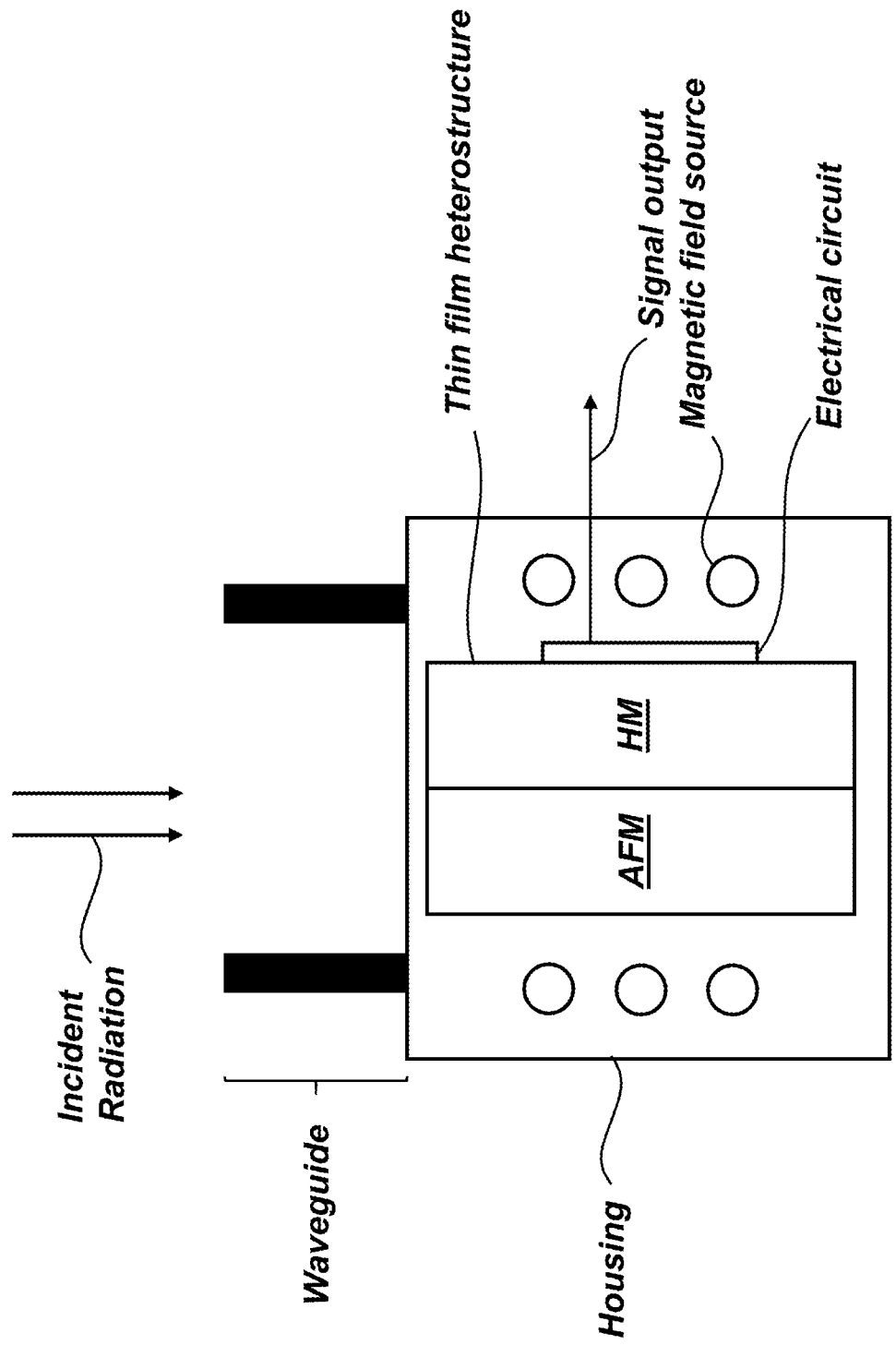
FIG. 1A-1 is a diagram illustrating one exemplary embodiment of a system for detection of sub-terahertz radiation employing a thin film heterostructure including an antiferromagnetic (AFM) layer and a heavy metal (HM) layer and a magnetic field generator.

Embodiments of the present disclosure provide systems and methods configured to generate pure spin current in response to receipt of sub-terahertz and terahertz radiation. As illustrated in FIGS. 1A-1B, the system can include a heterostructure, a circuit, and optionally a magnetic field generator. The system can optionally include a waveguide configured to guide electromagnetic radiation for incidence upon the heterostructure. The heterostructure can be a thin film structure formed from a plurality of thin films or layers. As an example, a first layer of the heterostructure can be formed from an antiferromagnetic (AFM) material and a second layer of the heterostructure can be formed from a heavy metal (HM) material or a topological insulator.

In alternative embodiments, the magnetic field generator can be omitted. In one aspect, a thin ferromagnetic layer can be positioned adjacent to AFM layer. As an example, the HM layer can be positioned in contact with a first side of the AFM layer and the ferromagnetic layer can be positioned on a second side of the AFM layer, opposite the HM layer. In this configuration, the exchange interaction, which is of quantum mechanical origin, can exert a strong short-ranged field (also referred to as an exchange field). This is not due to the stray field generated by the south and north poles in the magnetic layer. The ferromagnetic layer can have its easy axis perpendicular to the film plane, such as hexagonal close packed (hcp) cobalt or multilayers of Co/Pd or Fe/Pt. This configuration further benefits from the thin film configuration of the system, as a relatively thin AFM layer can be required, since the interaction is also an interface effect.

In another aspect, the magnetic field generator can be omitted under circumstances where the incident electromagnetic radiation is circularly or elliptically polarized. The polarization can be partial or full polarization. Under this circumstance, the ISHE detection does not require a magnetic field, as LH and RH magnons do not cancel out. That is, linearly polarized does not work in this configuration because it decomposes into two that create equal number of LH and RH magnons Embodiments of the heterostructure can employ a variety of different materials for the AFM layer. Non-limiting examples can include, but are not limited to, MnO, $\alpha$-$Fe_2O_3$, MnS, CrSe, FeS, MnTe, $RbMnTe_2$, $MnF_2$, $NiF_2$, $CoF_2$, $FeF_2$, $FeCl_2$, $FeI_2$, FeO, FeOCl, $CoCl_2$, $CrCl_2$, CoO, $NiCl_2$, $NiI_2$, NiO, Cr, $Cr_2O_3$, $LaMnO_3$, or $Nd_5Ge_3$. The thickness of the AFM layer can be within the range from about 10 nm to about 100 nm.

Embodiments of the heterostructure can employ a variety of different materials for the second layer. In general, the second layer can be formed from a material possessing strong spin-orbit coupling. The spin Hall angle is a figure of merit characterizing the strength of spin-orbit coupling. Accordingly, the second layer can be formed from metals or metal alloys having a spin Hall angle greater than or equal to about 0.1. As an example, the second layer can be formed from metals or metal alloys having a spin hall angle within the range of about 0.1 to about 0.35 (e.g., about 0.10 to about 0.15). The thickness of the second layer can be within the range from about 1 nm to about 10 nm The waveguide can be configured to direct the electromagnetic radiation incident upon the heterostructure such that the direction of microwave propagation is approximately parallel to the easy axis (e.g., the c-axis) of the crystal lattice of the AFM material.

The magnetic field generator can be configured to generate a magnetic field having a direction oriented approximately parallel to the c-axis of the crystal lattice of the AFM material and the direction of microwave propagation. The magnetic field generator can adopt a variety of configurations. Examples can include electromagnets, permanent magnets, a ferromagnetic layer positioned adjacent to the AFM layer.

In operation, the electromagnetic radiation can be received by the AFM layer. The electromagnetic radiation can have a frequency within the range from sub-terahertz frequencies to terahertz frequencies (e.g., from about 100 GHz to about 10 THz).

As discussed in greater detail below, spin current can be generated within the AFM layer in a variety of ways. In one embodiment, when a magnetic field is present, there can be two effects. First, the frequency of one mode (RH) can go up and the other can go down. When the up- or down-shifted frequency is equal to a selected frequency of interest (e.g., within the sub-terahertz or terahertz range), AFMR occurs, along with the absorption of the radiation. This frequency shift is approximately 28 GHz per tesla in magnetic field. The second effect is that, even if there is a slight shift in each mode so that there is a finite difference between the two modes, the net angular momentum is non-zero. This will result in a net spin current (due to unequal population between the two modes). It can be understood that the frequency shift (e.g., about 28 GHz) due to per tesla magnetic field is relatively small compared to the inherent AFMR frequency at zero field (hundreds of GHz to thousands of GHz). Thus, the application of a magnetic field in this context is for the purpose of generating net spin current for ISHE, rather than for tuning AFMR frequency.

In embodiments where the terahertz or sub-terahertz radiation possesses circular or elliptical polarization, the magnetic field generator can be omitted.

In further embodiments, the first layer of the heterostructure (the AFM layer) can be strained to a predetermined level (e.g., by introducing a residual stress via lattice mismatch with a substrate upon which the first layer is deposited. Such strain can changes the magnetic properties of the AFM layer, which changes the frequency within the range of sub-terahertz or terahertz frequencies at which the first layer injects spin current into the second layer as compared to the first layer in an unstrained state. That is, embodiments of the detector can be tuned to only detect electromagnetic radiation having certain frequencies, controlled by the level of strain within the AFM layer. The ability to change the frequency range is advantageous. In one aspect, frequency selectivity provides inherent filtering, which can improve signal to noise ratio while reducing or eliminating the need for additional filtering devices. In another aspect, such filtering can be desirable in for applications involving wireless communication (e.g., cellular telephones) which can require band rejection for regulatory compliance.

The spin current received by the second layer is converted to a potential difference by the Inverse Spin Hall Effect (ISHE). The circuit can be calibrated to output an electrical signal corresponding to the potential difference. Notably, as the power of the electromagnetic radiation increases, the spin current density increases, resulting in an increase in the potential difference. The electrical signal can be calibrated such that it is correlated (e.g., proportional to) to characteristics of the electromagnetic radiation (e.g., amplitude, power, etc.), providing detection of the electromagnetic radiation. In this manner, the system can function as a detector for terahertz and/or sub-terahertz electromagnetic radiation.

As noted above, the generated spin current is converted to electrical current or an open circuit voltage by the inverse spin Hall Effect. The inverse spin Hall Effect is an interface effect. That is to say, it requires a spin current to flow across the interface (e.g., the interface between the first layer and the second layer. As a result, the detector can be made using thin layers which can reduce the thickness of the active layers within the detector. The thickness of the first layer can range from about 10 nm to about 100 nm thick. When the second layer is formed from a heavy metal or heavy metal alloy, the thickness can range from about 2 nm to about 10 nm for the second layer.) When the second layer is formed from a topological insulator, the thickness can range from about 4 nm to about 10 nm.

The use of spin-based thin films is fundamentally different from other techniques currently employed for detection of sub-terahertz and terahertz radiation, such as inductive or absorption detection that depend on the total magnetic volume. The ability to employ thin films provides a variety of advantages, including but not limited to, miniaturization easy integration with planar devices, and reduced cost to manufacture (e.g., because less material is required and/or compatibility with lithographic fabrication techniques).

Pure spin current is generated by interaction of the sub-terahertz or terahertz radiation with the AFM/HM heterostructure material, which produces an electrical charge current within the heavy metal layer through the inverse spin Hall Effect (ISHE). The system can further include a circuit configured to detect the generated electrical current or volume.

Embodiments of the heterostructure can employ a variety of different HM materials. In general, it is desirable for the HM material to possess relatively high spin-orbit coupling to increase the magnitude of ISHE. A figure of merit is the spin Hall angle, which represents the efficiency of spin-orbit coupling. The spin Hall angle of the HM layer can adopt positive or negative values. In general, the detector can be configured to operate using both positive and negative segments back and forth to get the total length of the detector as large as possible. As the electric field (from the ISHE open-circuit case) is in one direction, going back and forth with one HM will cancel, which prevents using multiple segments to get the total length and therefore the amplification of the voltage. Notably, + spin Hall angle HM in one direction and − SHA HM in the opposite direction can be employed. The width of the segments does not matter and, therefore, numerous parallel pairs can be accommodated into a given area by micro-fabrication.

In non-limiting embodiments, the material forming the second layer can be selected from metals or metal alloys having a high spin Hall angle. While the range of spin Hall angles is not limited, in certain embodiments, the material forming the second layer can have a spin Hall angle greater than or equal to about 0.1 (e.g., within the range of about 0.1 to about 0.35, such as about 0.10 to about 0.15). Examples of the second material can include, but are not limited to, heavy metals such as Pt, W, Bi Ta, or AuPt alloys. In alternative embodiments, a topological insulator can be employed in lieu of a heavy metal, as this class of materials possesses strong spin-orbit coupling and even larger spin Hall angles (e.g., $Bi_2Se_3$).

To better facilitate understanding of the disclosed embodiments, examples are presented below that demonstrate pure spin current generation and simultaneous electrical detection in a uniaxial AFM material, $Cr_2O_3$. The former is accomplished by driving the AFM spin precession into resonance using linearly polarized sub-THz radiation. Through the inverse spin Hall Effect (ISHE), the resonantly generated spin current is converted into a DC voltage.

Figure 5:
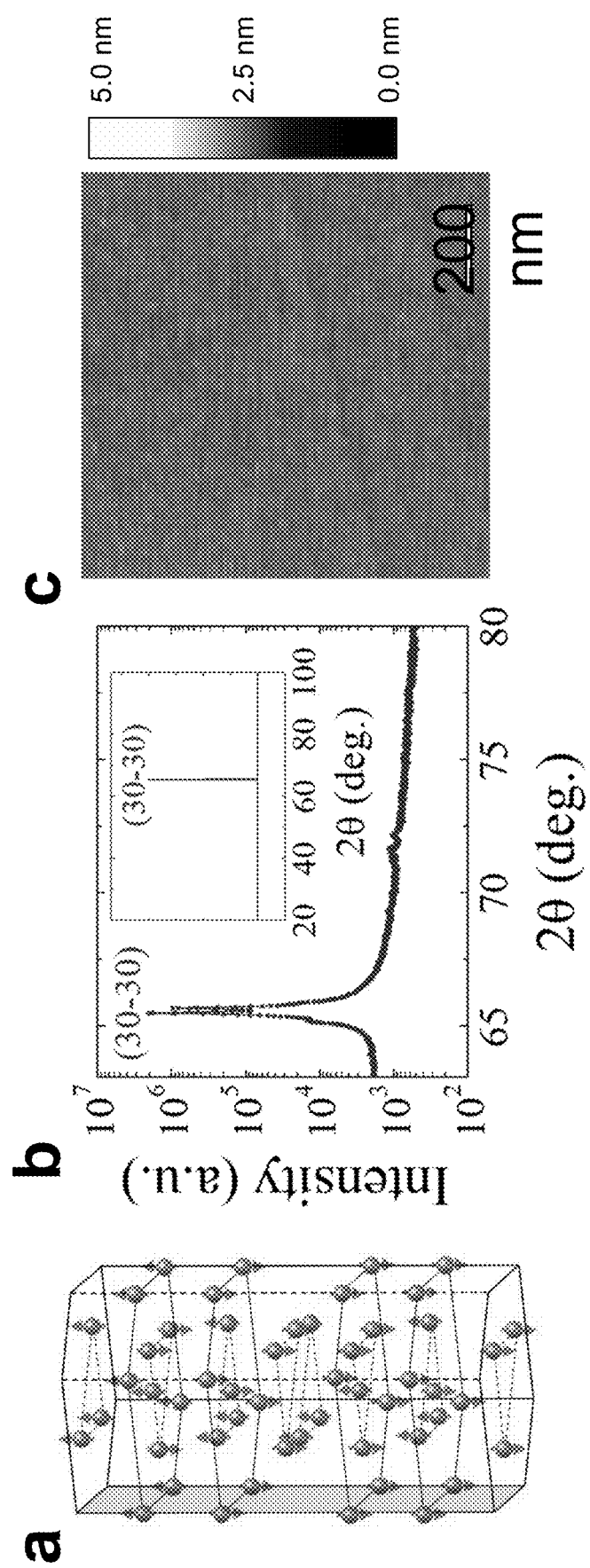
FIG. 5 illustrates the crystal structure and surface morphology characterization for an exemplary AFM layer formed from $Cr_2O_3$. a, the crystal structure of $Cr_2O_3$, the symbols and arrows indicate the Cr atoms and the spin associated with them, respectively. The colored plane is (10$\bar{1}$0)-plane. b, X-ray diffraction (XRD) of $Cr_2O_3$(10$\bar{1}$0) single crystal. The inset is XRD of $Cr_2O_3$(10$\bar{1}$0) over a wide 2θ range. c, Atomic force microscopy image of the polished surface of $Cr_2O_3$(10$\bar{1}$0) single crystal.

As illustrated in FIG. 5, $Cr_2O_3$ is a uniaxial AFM insulator with the easy axis along the c-axis of the hexagonal lattice (0). Because of its relatively simple spin structure and accessible AFMR frequency (~0.165 THz at 0 K) and SF field (6.0 T at 0 K) (0), $Cr_2O_3$ is chosen for this example. As shown in FIG. 1A-1, incident radiation (0.240 THz continuous microwaves) are generated by a solid-state source and propagate into a corrugated waveguide at the center of a 12.5 T superconducting magnet. The $Cr_2O_3$ (10-10) slab is mounted on a piece of sapphire secured to a Teflon stage located at the exit of the waveguide.

FIG. 1b depicts the structure and measurement geometry of the heterostructure. The heterostructure is oriented with the c-axis parallel to both the DC magnetic field $H_0$ and the microwave propagation direction k; the microwave magnetic field component h is kept in the sample plane and perpendicular to the c-axis of $Cr_2O_3$. Similar to the conventional ferromagnetic (FM) spin pumping, the AFM spins in $Cr_2O_3$ are driven into resonance at a fixed but much higher microwave frequency by sweeping the DC magnetic field. A pure spin current is then injected into the adjacent heavy metal (HM) layer, which in turn produces a charge current in Pt, Ta, or the Pt-Ta hybrid channel (Methods) through the ISHE and results in an open-circuit DC voltage $V_{ISHE}$. FIG. 1c summarizes the magnetic resonance frequency as a function of $H_0$ when it is applied along the c-axis of $Cr_2O_3$. Below the SF field of 6.0 T, there are two distinct branches corresponding to the two Eigen-modes of AFM spin wave excitations or magnons, viz. right-hand (RH) and left-hand (LH) spin precessions with opposite chiralities (14, 18, 19). At $H_0=0$, these two modes are degenerate at $$\frac{\omega_m}{2\pi} = 0.165 \text{ THz,}$$

as shown in FIGS. 1d and 1e. This is fundamentally different from FM materials in which the sole magnon mode is right-handed. Since these two modes carry equal but opposite angular momenta, ±h (14), the net spin angular momentum is zero if they are equally populated. When $H_0$ is applied along the c-axis of $Cr_2O_3$, the degeneracy between RH- and LH-modes is lifted, and the frequencies of the two branches are given by $\omega/\gamma=\sqrt{2H_EH_A+(H_0\alpha/2)^2}\pm H_0(1-\alpha/2)$ (19), where $\gamma=28$ GHz/T is the gyromagnetic ratio, $H_E$ and $H_A$ are effective fields of the inter-sublattice exchange interaction and the easy-axis anisotropy, $\alpha=\chi_\parallel/\chi_\perp$ is the ratio of the magnetic susceptibilities between the parallel and perpendicular directions, and the +(−) sign refers to the RH (LH) mode.

At low temperatures, $\alpha\approx0$, and $\omega/\gamma=\sqrt{2H_EH_A}\pm H_0$, which is represented by the two straight lines in FIG. 1c. In our experiments, the microwaves are linearly polarized, and the frequency is held at 0.240 THz (horizontal dashed line) while $H_0$ is swept; therefore, only the RH-mode can be excited when the upper branch intercepts the horizontal dashed line. For $Cr_2O_3$, the low-temperature resonance field of the RH-mode is estimated to be ~2.7 T, which is confirmed by EMR experiment, discussed in detail below in Item 1 of the Appendix.

As the $H_0$ strength reaches the SF field, spins in both sub-lattices switch abruptly to align nearly perpendicular to $H_0$ with a small inclination (0). An EMR feature is observed at the SF transition (See Item 1 of the Appendix). A new resonance mode emerges above the SF field, as depicted in FIG. 1f. In this mode, the total magnetic moment $m=m_1+m_2$ precesses around $H_0$ with the RH chirality (19). This is essentially equivalent to the FMR mode in ferromagnets. This is referred to herein as quasi-ferromagnetic resonance (QFMR) mode to distinguish it from the FMR mode of the fully spin-aligned state that could only be accessed at extremely high magnetic fields. The QFMR frequency is given by $\omega/\gamma=\sqrt{H_0^2-2H_EH_A}$ (19). For 0.240 THz, the QFMR is estimated to occur at ~10.5 T in $Cr_2O_3$(see Item 1 of the Appendix for EMR signal at QFMR). By sweeping $H_0$ up to 12 T, both the RH AFMR and the QFMR modes can be excited in $Cr_2O_3$.

At these resonances, uniformly precessing spins in $Cr_2O_3$ form a k=0 magnon reservoir. Similar to FM spin pumping, when the magnon reservoir is in contact with a HM layer such as Pt, a pure spin current flows across the interface via magnon-electron interactions, and is consequently converted to an open-circuit DC voltage in Pt due to the ISHE. Electrical voltage signals have been observed at both resonance fields identified by EMR.

Figure 6:
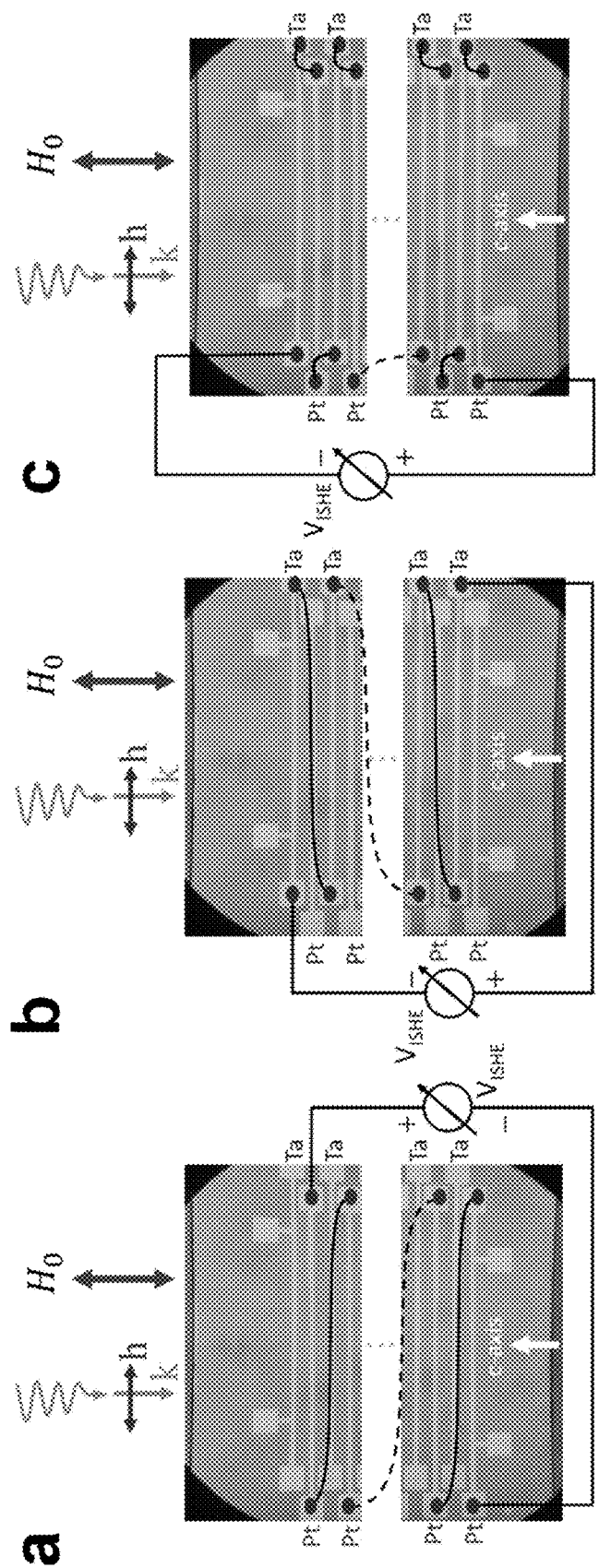
FIG. 6 illustrates the measurement geometry of sub-THz spin-pumping experiments, a, Pt-channel-only: only Pt strips are wire-bonded in series. b, Ta-channel-only: only Ta strips are wire-bonded in series. c, Pt-Ta hybrid channel. In all three panels, black lines indicate conductive wires that connect the ends of the strips. $H_0$ is an external magnetic field, and h and k are the magnetic component and wavevector of the 0.240 THz microwaves, respectively. $V_{ISHE}$ is the open-circuit voltage. The white arrows depict the c-axis of $Cr_2O_3$(10$\bar{1}$0)

To distinguish the pure spin current effect from other spurious effects, Pt and Ta are employed as two independent detection channels (See FIG. 6). Because of the opposite sign in their spin Hall angles (7-9), the same pure spin current must produce voltage signals with opposite polarities in Pt and Ta channels. On the other hand, any spurious electrical signal generated by microwave rectification or heating related thermoelectric emf may maintain the same polarity in Pt and Ta. Indeed, sharp voltage features are unmistakably resolved at 2.7 T in two independent Pt and Ta channels, as shown in FIGS. 2a and 2c. The resonance field corresponds well to the AFMR field identified by EMR. More importantly, the Pt and Ta channels register opposite AFMR voltages at 5 K. At 10.5 T where QFMR occurs, the same opposite polarity is observed as shown in FIGS. 2b and 2d. This contrasting voltage polarity between the Pt and Ta channels at both AFMR and QFMR is a defining character of the resonantly generated pure spin current. Since the ISHE voltage is proportional to the resistivity of the detecting channel providing the same spin-charge conversion efficiency, and Ta is much more resistive (>a factor of 10) than Pt, we expect a larger voltage response in Ta (See Item 2 of the Appendix).

After confirming the opposite voltage polarities in the independent Ta-only and Pt-only channels, neighboring Pt and Ta were wired strips in series (See FIG. 6c) to form a single long hybrid channel. All Pt and Ta strips on the chip are connected to further enhance the total voltage signal output. In the following experiments, unless otherwise specified, this hybrid detector geometry is adopted for electrical detection. To corroborate the pure spin current nature of the DC voltage signals, the direction of $H_0$ is reversed and therefore the spin polarization of the pumped spin current. A completely inverted voltage signal is observed on the negative field side (FIG. 2e). The same complete voltage inversion is observed for the QFMR despite complicated line-shape (shown in FIG. 2f). Note that any heating related thermoelectric emf cannot possibly produce voltage sign reversal when the magnetic field is reversed. Hence, the observation of the two sign reversals leads us to unambiguously conclude that the DC voltage in HM detectors stems exclusively from pure spin current generated by resonant magnon excitations. Furthermore, this confirms that the ISHE voltages have a linear dependence on microwave power (See FIG. 7).

Figures 1, 1A, 2:
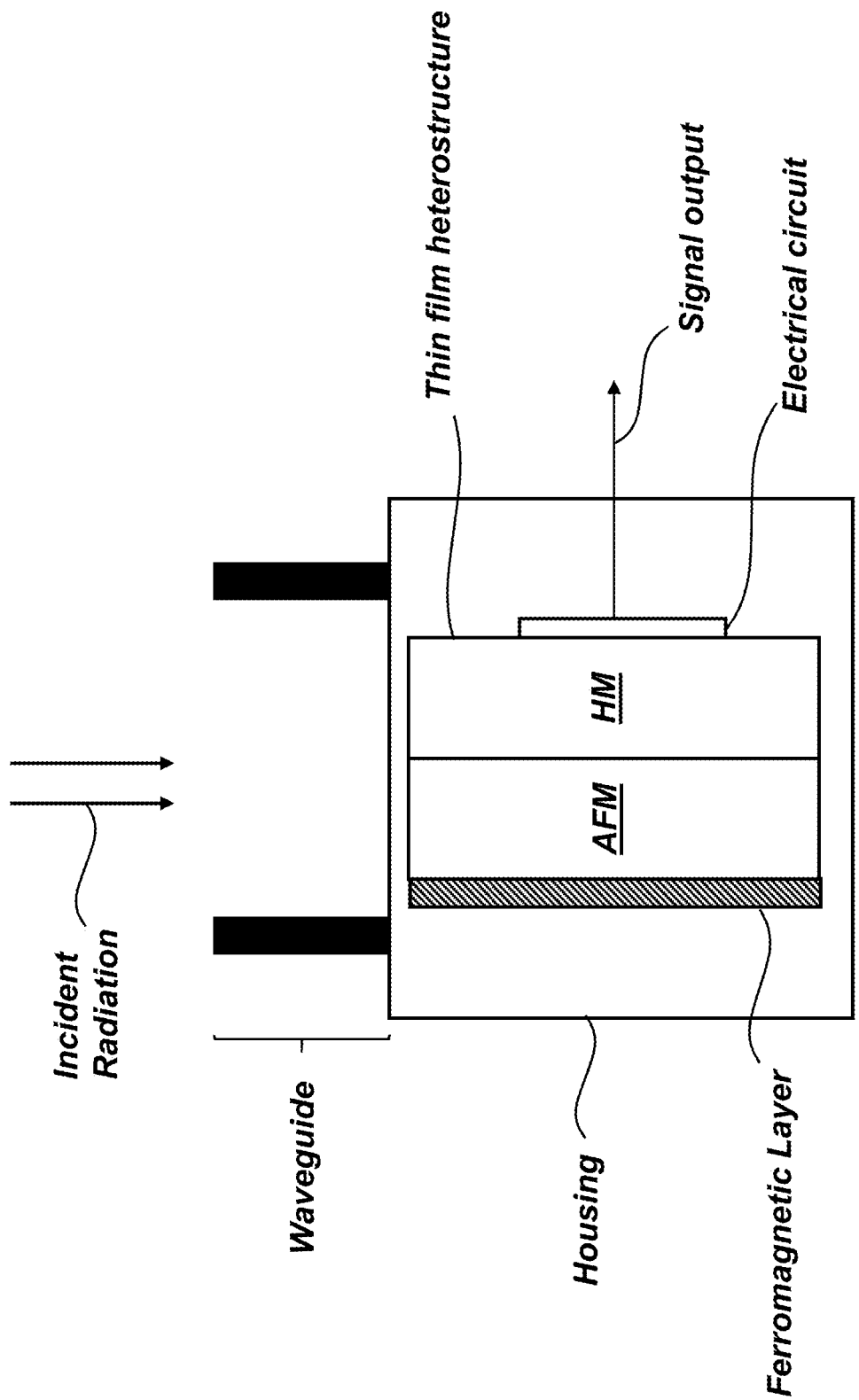
Figures 1, 1A, 2, 3:
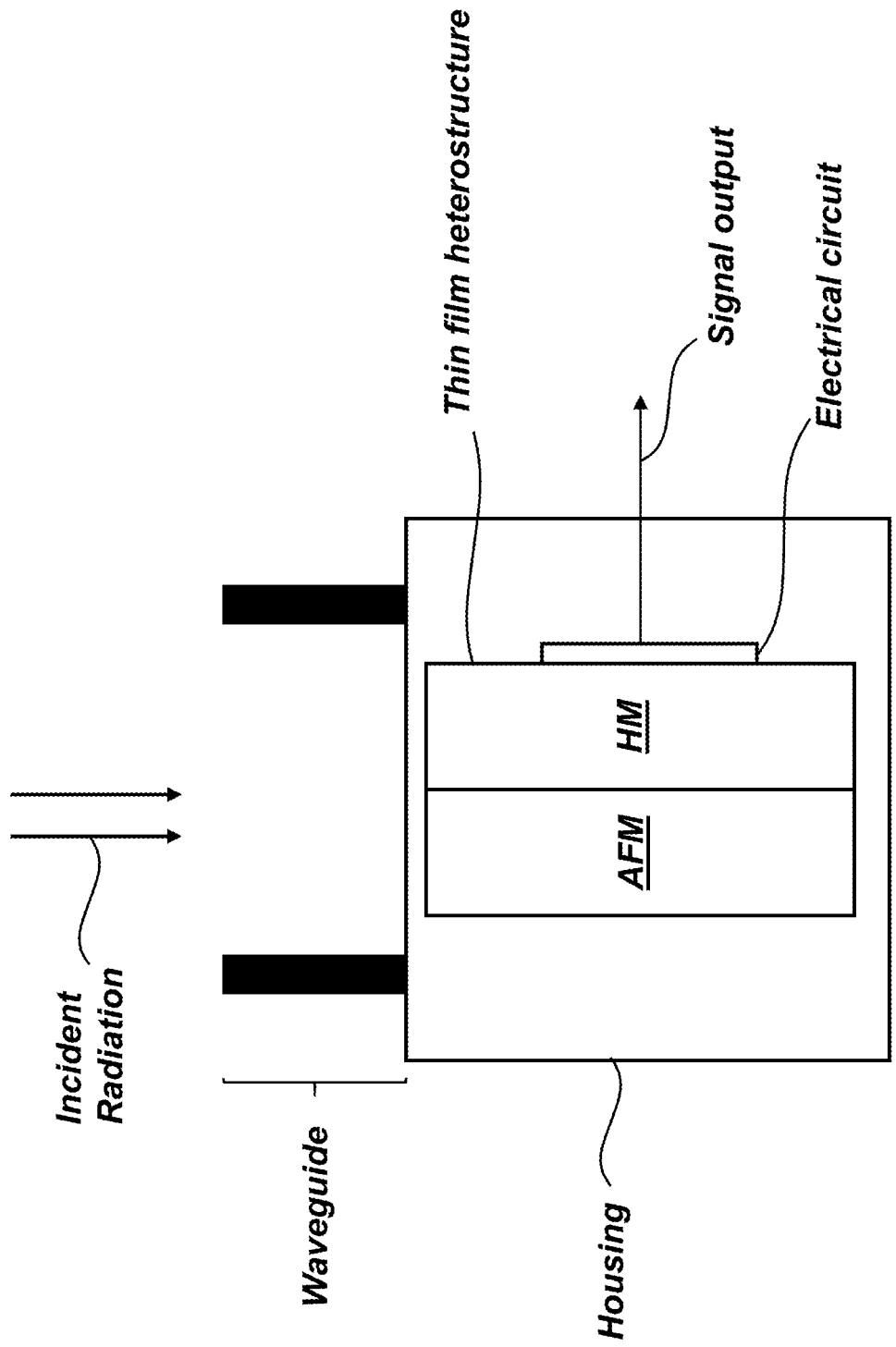
Figure 1B:
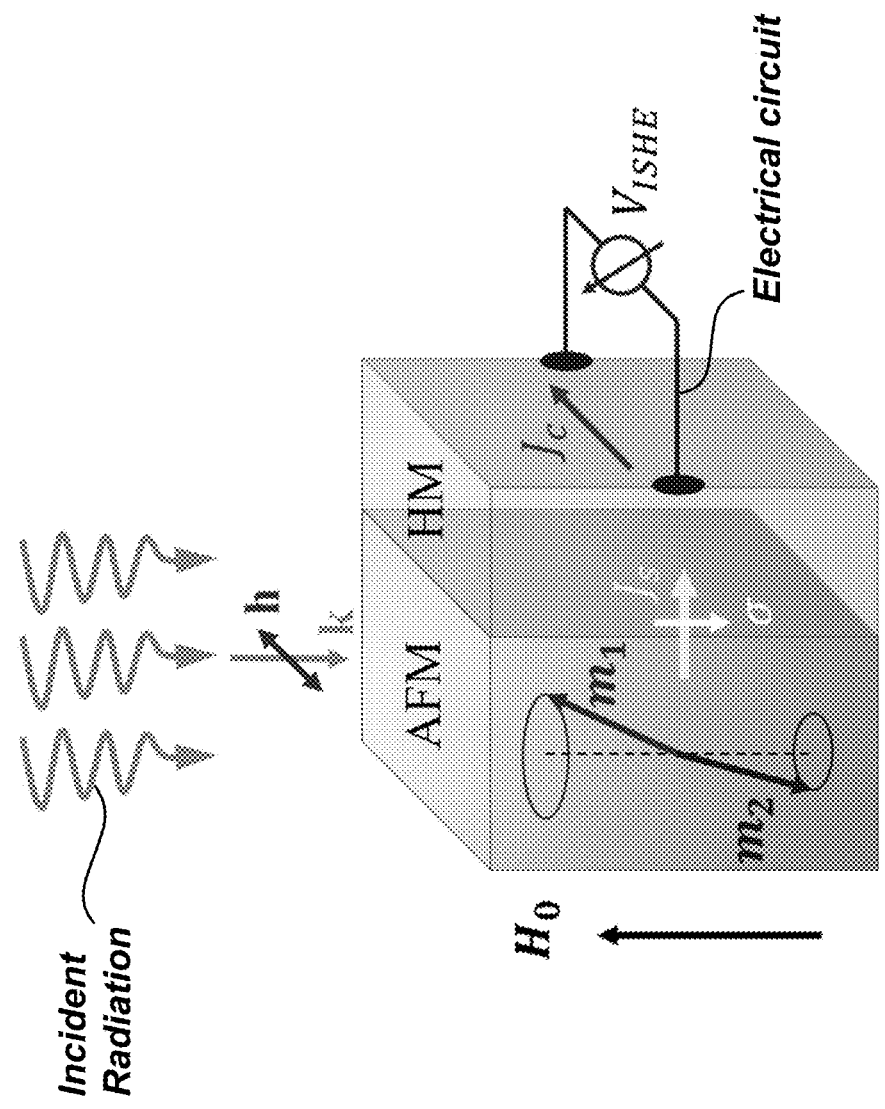
FIG. 1B is a diagram illustrating the interaction of the thin film heterostructure with incident terahertz radiation and resultant spin current injection. Two-sublattice magnetic moments, $m_1$ and $m_2$, are excited into resonance, and spin current $J_s$ with spin polarization σ generates charge current $J_c$ in the HM layer.
Figure 1C:
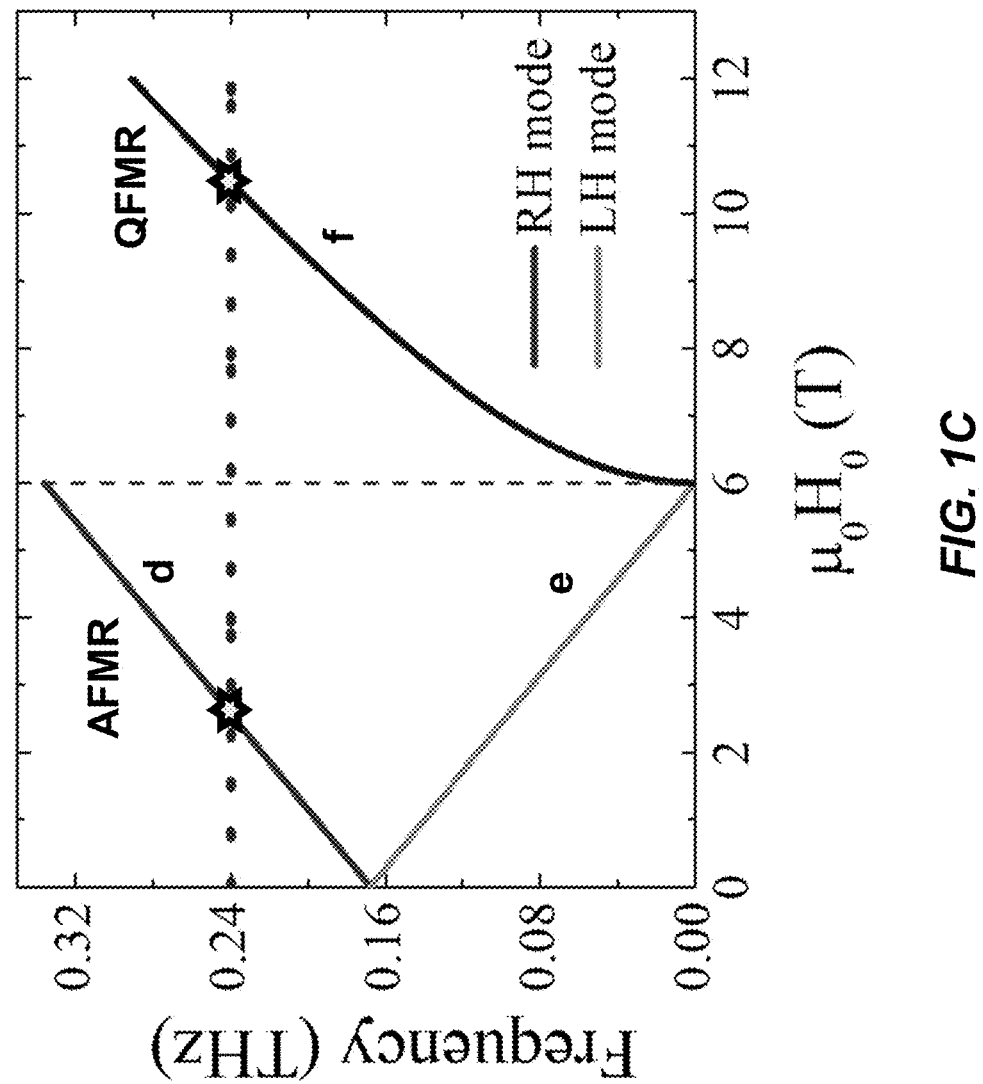
FIG. 1C is a plot of magnetic resonance frequency as a function of $\mu_0 H_0$ applied along the c-axis of an exemplary heterostructure including $Cr_2O_3$ as the AFM material at 0 K.
Figure 1F:
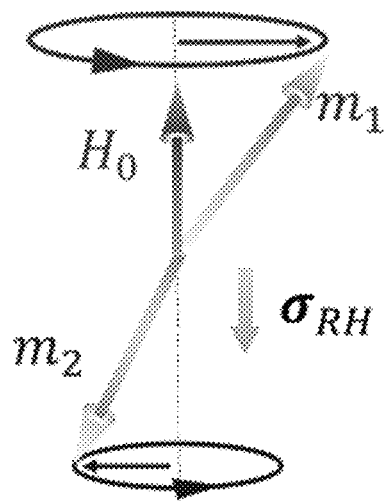
FIG. 1F is a schematic illustration of the eigenmode of QFMR.
Figure 1F:
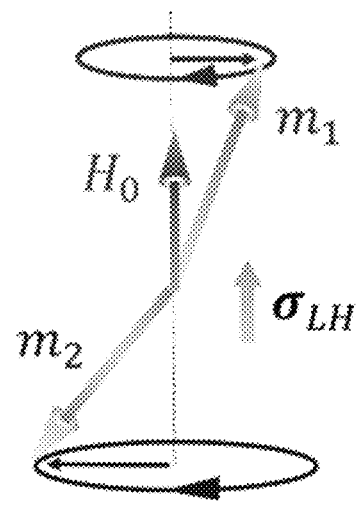
Figure 1F:
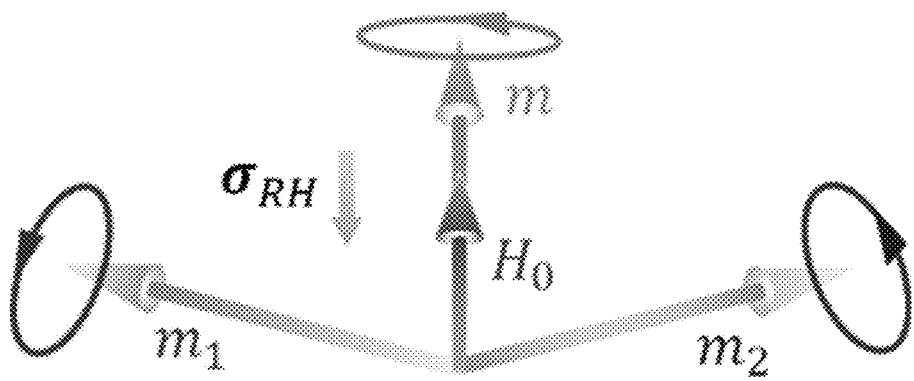
Figure 2:
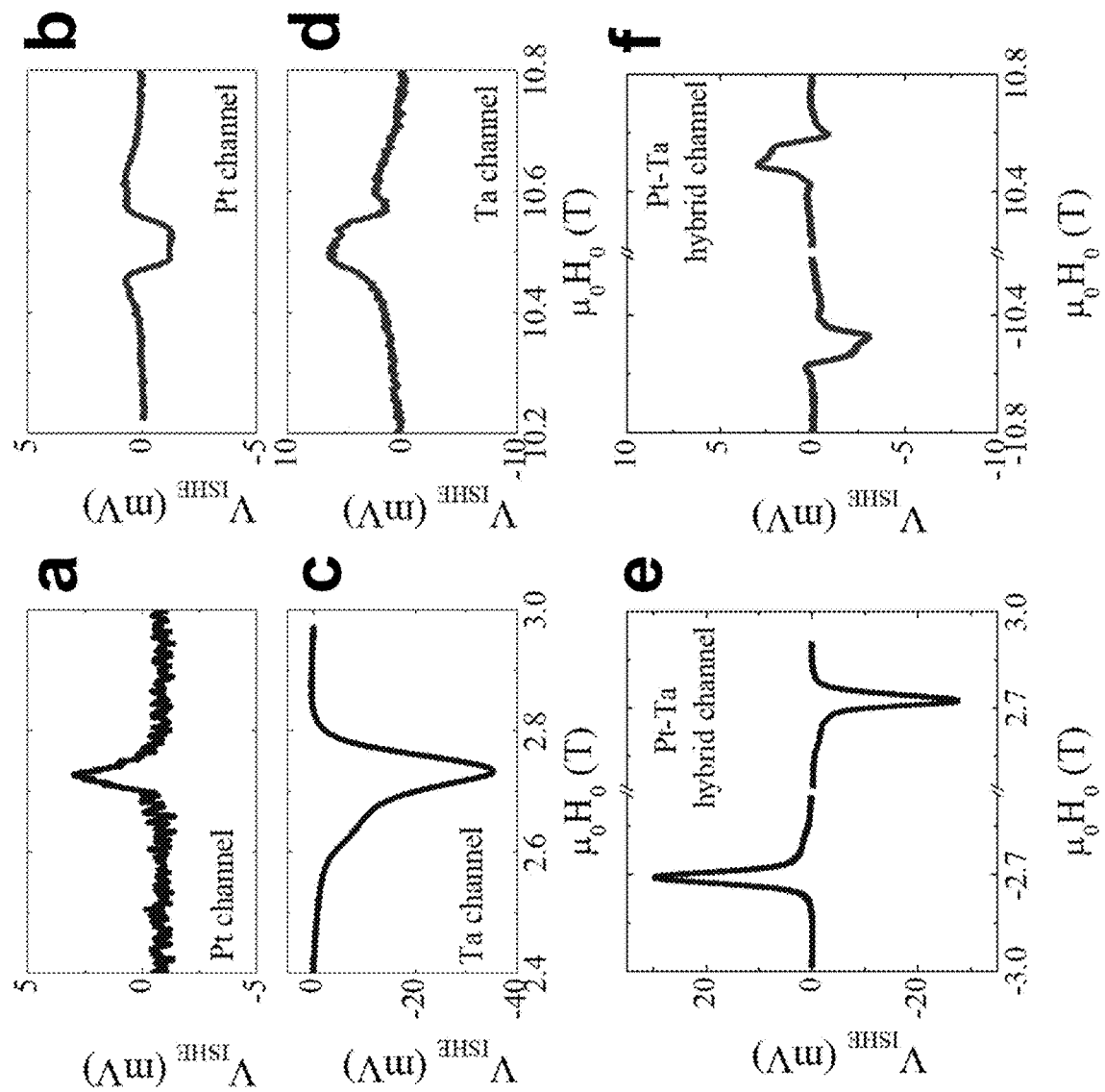
Figure 3:
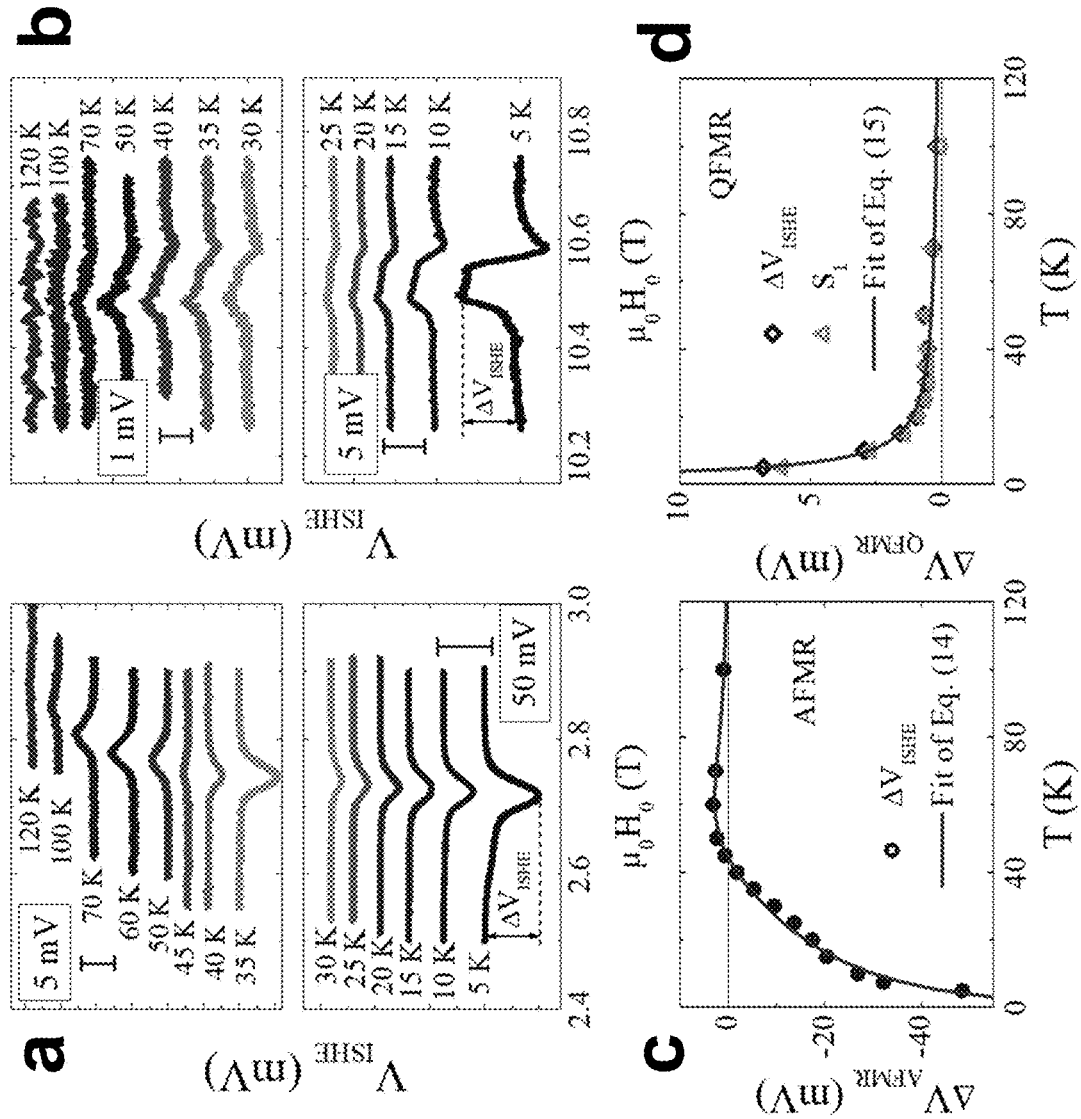

A more rigorous examination of the low-temperature behaviors of AFMR and QFMR shown in FIG. 2 reveals something counterintuitive. With the same detecting HM, the ISHE voltage feature at AFMR and the main feature at QFMR show opposite signs, which contradicts the simple picture of coherent spin pumping. As schematically illustrated in FIGS. 1d and 1f, the RH-AFMR and the QFMR Eigenmodes exhibit the same spin polarization, hence the resulting ISHE voltages should also have the same polarity for a fixed HM. The apparent contradiction implies that coherent spin pumping is not the sole mechanism.

Figure 8:
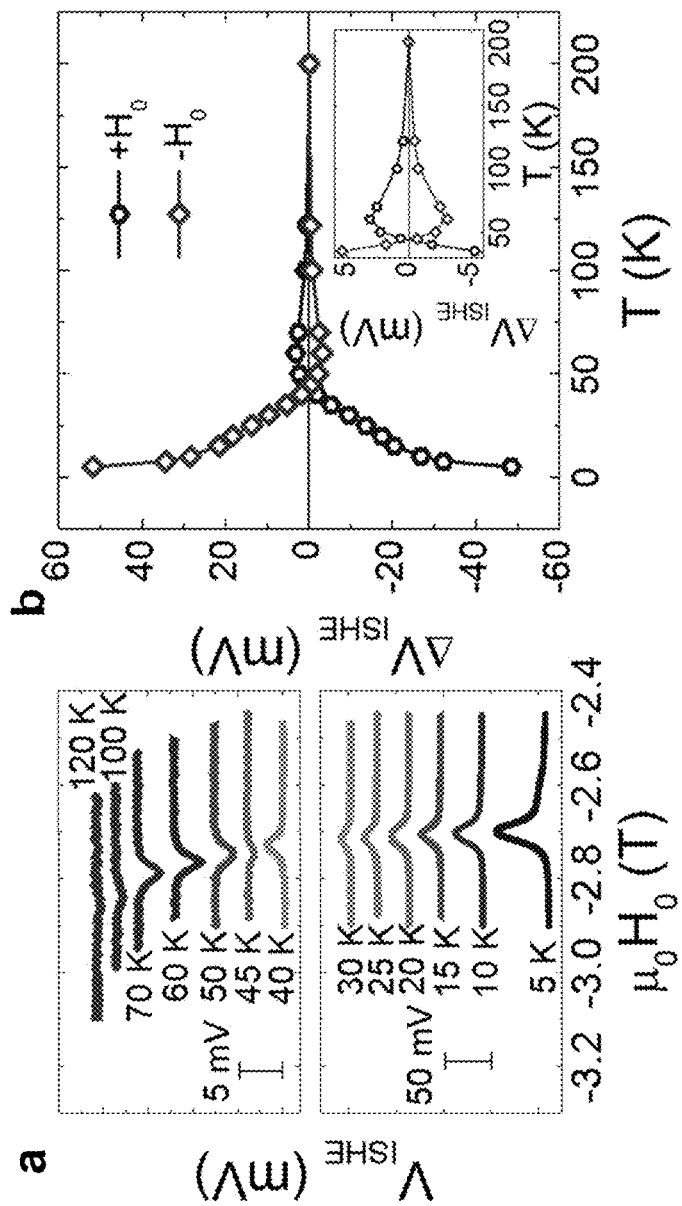
FIG. 8 illustrates plots of the ISHE signal at AFMR under negative external magnetic fields $H_0$. a, ISHE signal as a function of the negative magnetic field $H_0$ at different temperatures. $H_0$ is along the easy axis of $Cr_2O_3$(10$\bar{1}$0) crystal. b, Temperature dependence of ISHE signal magnitude under positive and negative magnetic fields. Inset of (b): the ISHE signal above 30 K.
Figure 9:
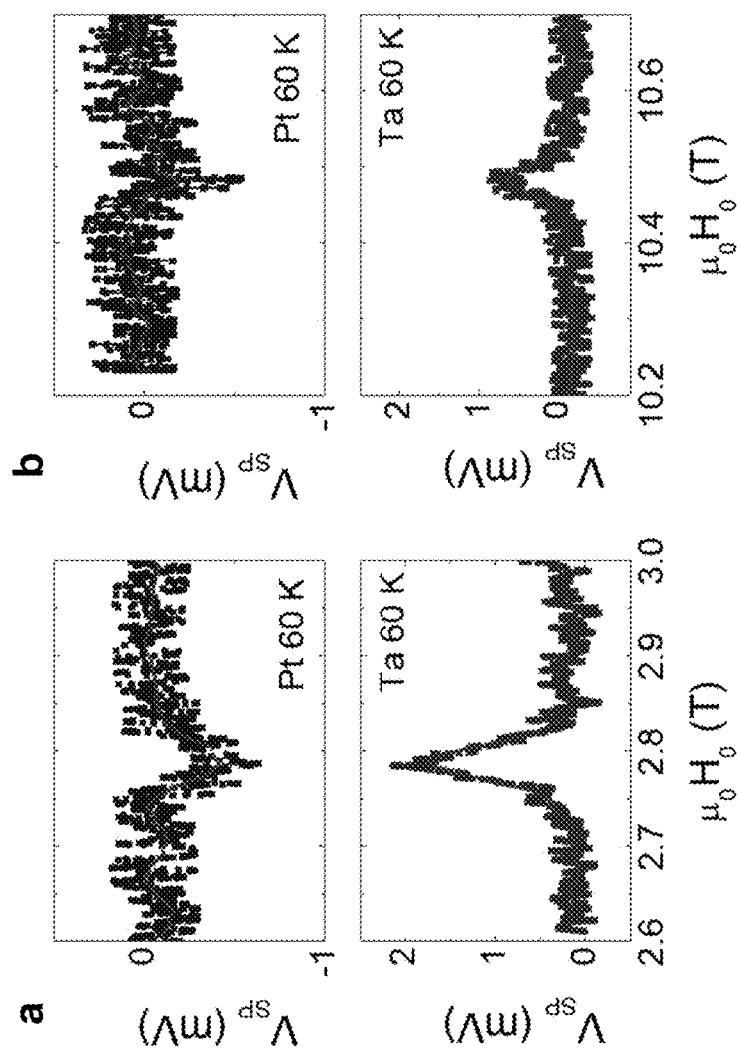
FIG. 9 presents plots of ISHE signal from Pt- and Ta-only channels at 60 K. a, ISHE signal at AFMR for Pt (upper panel) and Ta (lower panel) channels. b, ISHE signal at QFMR for Pt (upper panel) and Ta (lower panel) channels. The red curves in (a) and (b) are smoothened ISHE signals. At AFMR, the ISHE signals of the Pt and Ta channel at 60 K have opposite signs with that at 5 K (FIG. 2a for Pt and FIG. 2c for Ta). In contrast, the ISHE signal for Pt and Ta at QFMR remains the same sign between 60 K and 5 K (FIG. 2b for Pt and FIG. 2d for Ta), which is expected since for both the coherent and incoherent magnons have the same chirality in the QFMR mode. At and above 60 K, the QFMR voltage signal shows a single Lorentzian peak with a slightly larger linewidth than that of the AFMR peak.

To better understand the origin of the sign discrepancy, the ISHE voltage measurements are performed over a wide range of temperatures. FIG. 3a plots the ISHE voltage at AFMR for positive magnetic fields from 5 to 120 K. The voltage signal is negative at low temperatures and becomes smaller as temperature is raised. It crosses zero at about 45 K and stays positive at higher temperatures until it finally diminishes at around 120 K. A similar sign change is also observed for negative magnetic fields (See FIG. 8). In contrast, the main ISHE peak at QFMR (FIG. 3b) always stays positive and monotonically decreases with an increasing temperature until it finally vanishes above 100 K. We have also confirmed the sign change pattern of the ISHE signals by comparing the Pt-only and Ta-only channels (See FIG. 9).

Figure 16:
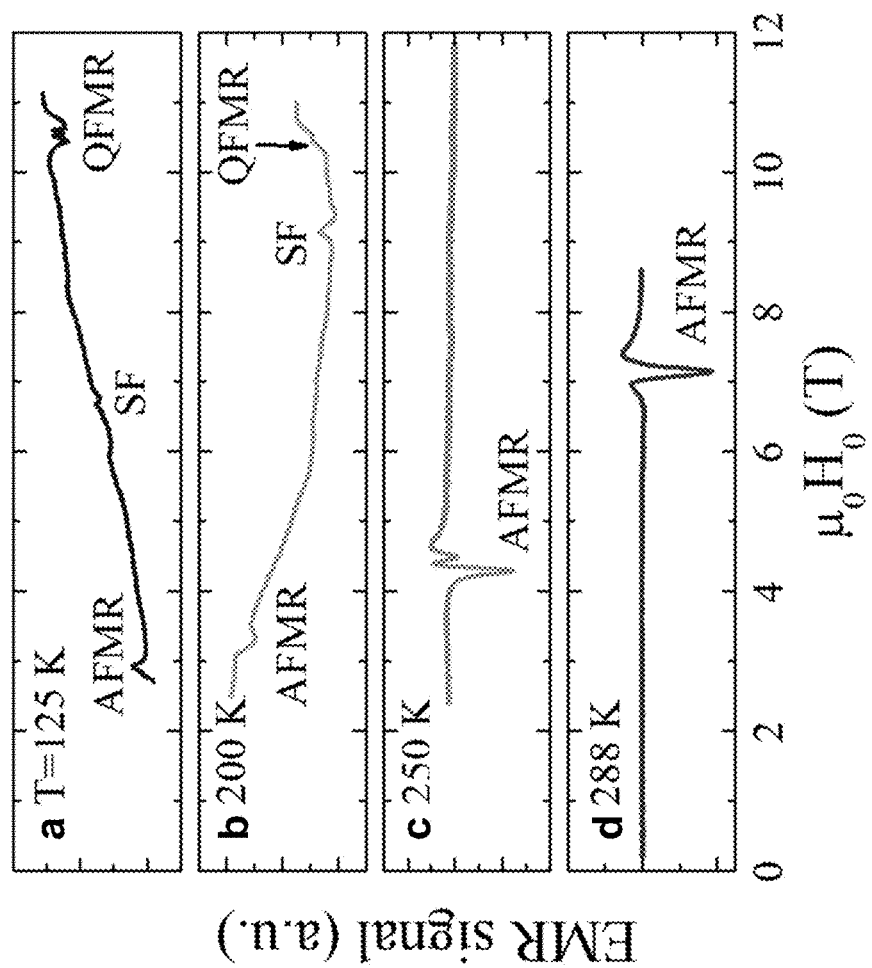
FIG. 16 presents plots of EMR signals in $Cr_2O_3$ crystal at 125 K (a), 200 K (b), 250 K (c) and 288 K (d). EMR signals at 125 K and 200 K are measured by the standard lock-in technique via modulating the intensity of the microwave source, whereas EMR signals at 250 K and 288 K are measured by modulating the magnetic field amplitude through an induction coil. The DC magnetic field is applied along the c-axis of $Cr_2O_3$. The positions of the AFMR, SF resonance and QFMR are marked in each panel.
Figure 17:
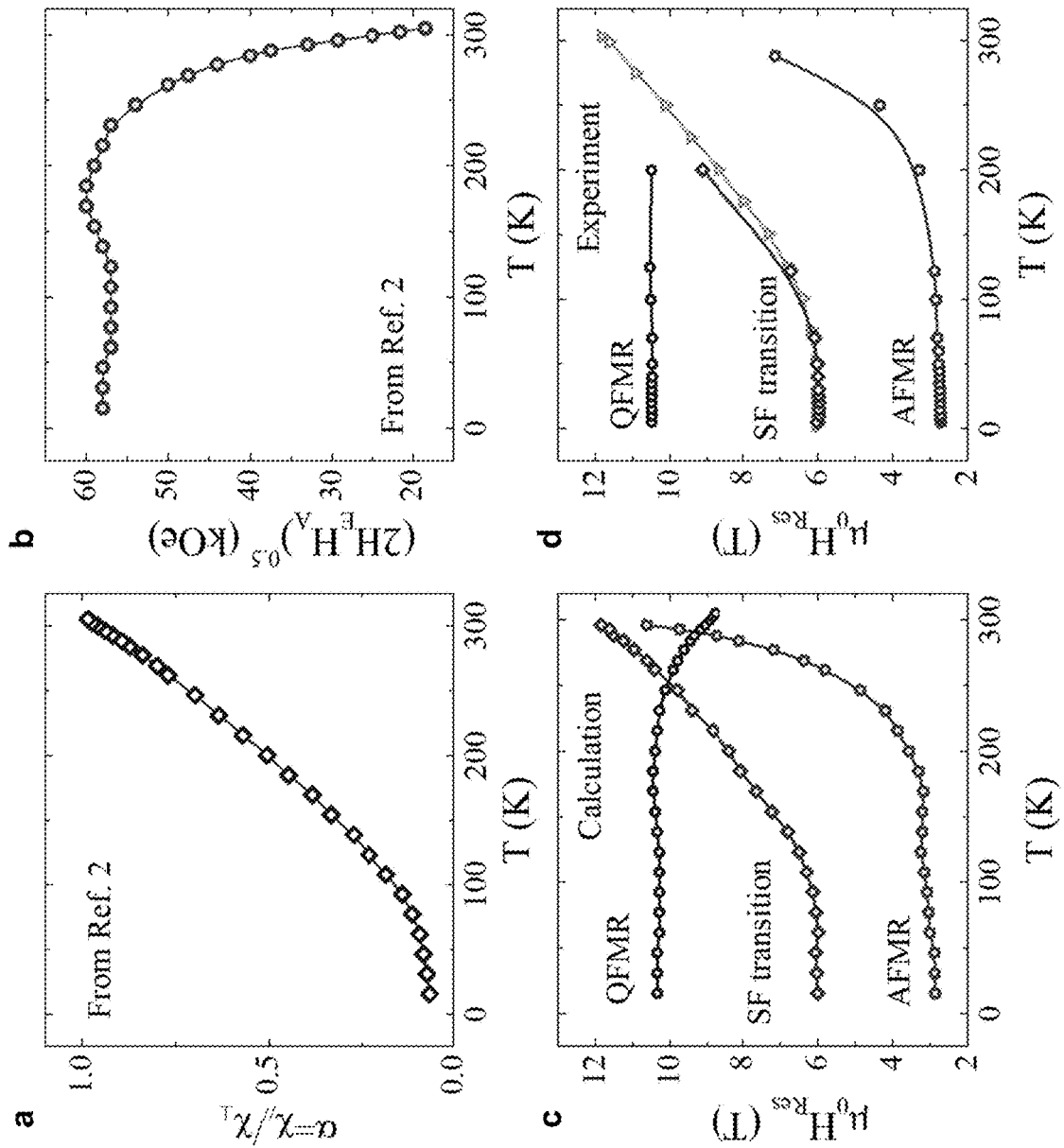
FIG. 17 presents temperature dependence of magnetic resonance fields of $Cr_2O_3$ crystal under 0.24 THz microwaves. a, Temperature dependence of the α value of $Cr_2O_3$ crystal. The data are extracted from (2). b, Temperature dependence of $\sqrt{2H_EH_A}$ of $Cr_2O_3$ crystal. The data are extracted from (2). c, Magnetic resonance fields calculated based on Eqs. (S2)-(S4). The values of $\sqrt{2H_EH_A}$ and α for $Cr_2O_3$ are taken from (2) as depicted in a and b. d, Magnetic resonance fields obtained from our experimental results. For the SF field, the yellow triangles and purple diamonds are determined from the SSE measurements and EMR measurements, respectively. The AFMR field and QFMR field are obtained from the EMR signals.
Figure 18:
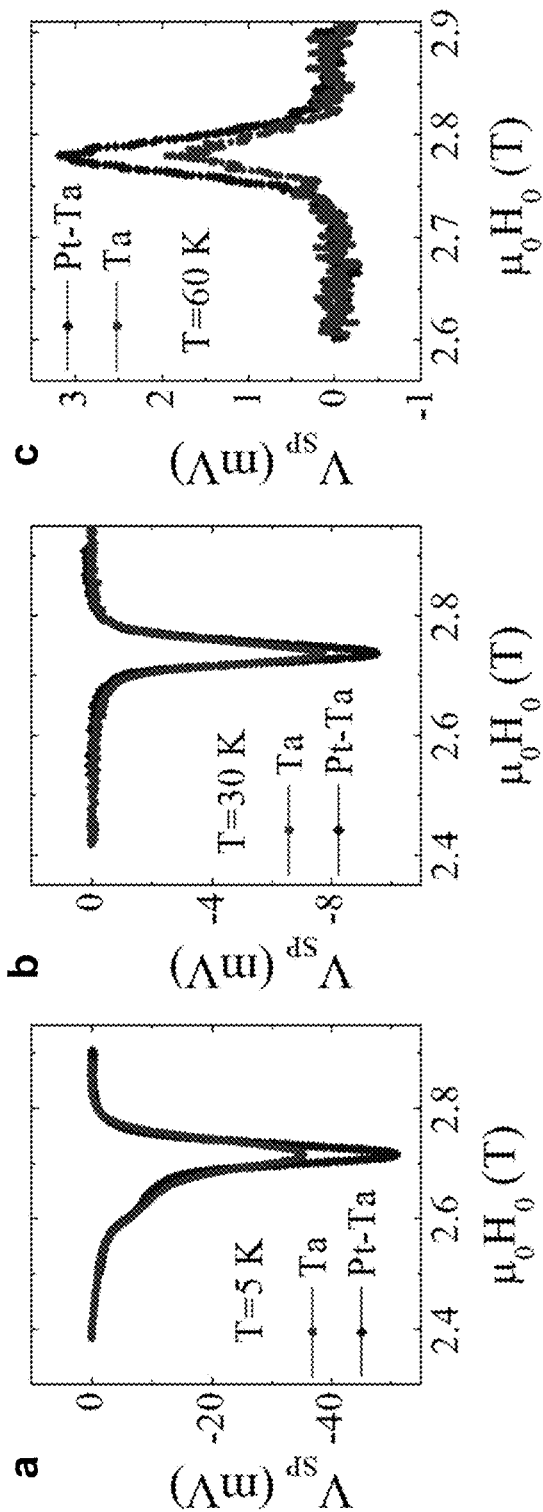
FIG. 18 Presents voltage signals at AFMR detected with Pt-Ta hybrid channel and Ta-channel at 5 K (a), 30 K (b), and 60 K (c). The magnetic field is applied along the easy-axis of the antiferromagnetic spins.
Figure 19:
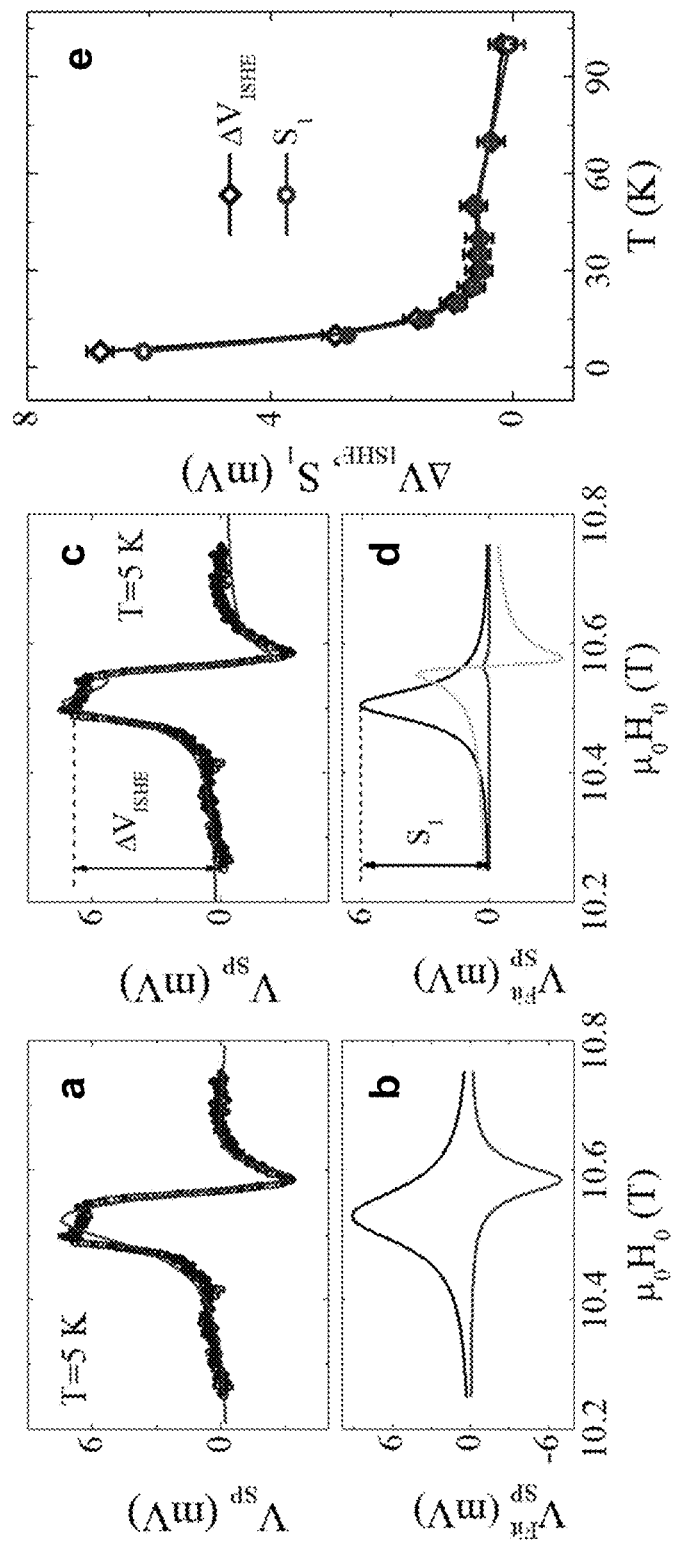
FIG. 19 presents analysis of the ISHE voltage signals at QFMR using two-peak fitting. a, Voltage signal (blue) at 5 K and fit (red) using Eq. (S5). b, Decomposed fitting curves in a to show a symmetric peak at 10.529 T (black) and a symmetric dip at 10.585T (red). c, Voltage signal (blue) at 5 K and fit (red) using Eq. (S6). $\Delta V_{ISHE}$ is the peak height of the QFMR signal measured from the maximum point to the baseline. d, Decomposed fitting curves in c to show a symmetric peak at 10.506 T (black), a symmetric (red), and an antisymmetric (green) peak at 10.565 T. $S_1$ is the magnitude of the symmetric peak as indicated by the arrow. e, Temperature dependence of the peak magnitude of QFMR voltage $S_1$, which is taken from the fitting results as shown in d. The error bars of $\Delta V_{ISHE}$ and $S_1$, are from the noise level in the experimental data and the fitting, respectively.
Figure 20:
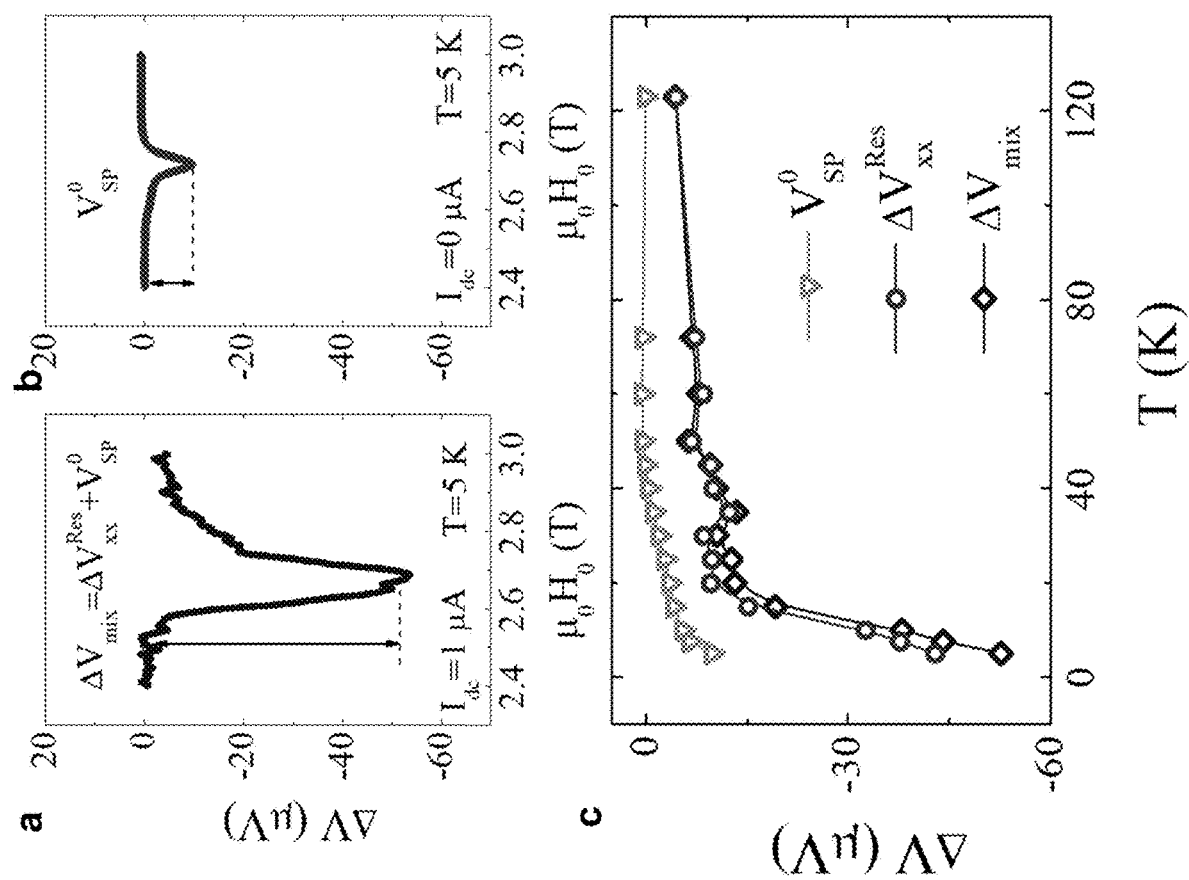
FIG. 20 presents plots of heat-induced voltage variation of the Pt-Ta hybrid channel at AFMR. a, Relative change of voltage in the Pt-Ta hybrid channel under a 1 μA DC current as a function of magnetic field under 0.240 THz microwaves with a power of 55 mW. This voltage variation $\Delta V_{mix}$ contains a sum of $\Delta V_{xx}^{Res}(=I_{DC}\Delta R_{xx})$ that is caused by heating-induced resistance increase ($\Delta R_{xx}$) and a spin pumping signal $V_{sp}^0$. $V_{sp}^0$ is the raw spin pumping signal without the 5000 amplification. The preamplifier for resistance measurements are not used here. b, Raw spin pumping voltage signal in the Pt-Ta hybrid channel in the absence of any DC current. c, Temperature dependence of $V_{sp}^0$, $\Delta V_{xx}^{Res}$ and the total change $\Delta V_{mix}$.
Figure 21:
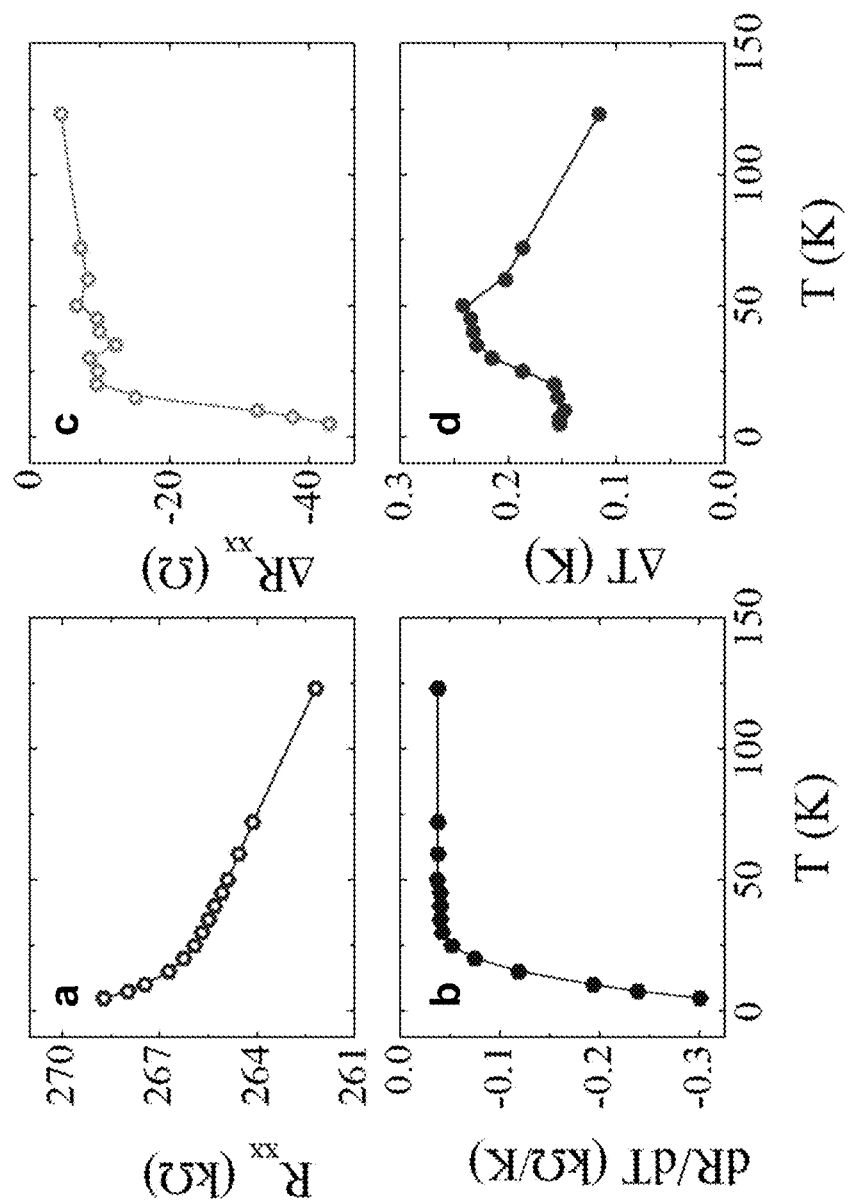
FIG. 21 presents plots of heating-induced resistance and temperature changes of the Pt-Ta hybrid channel at AFMR. a and b, Temperature dependence of the longitudinal resistance of the Pt-Ta hybrid channel and its temperature derivative, respectively. c and d, Temperature dependence of the longitudinal resistance variation and the resulting sample temperature rise ΔT caused by the microwave heating at resonance, respectively. The longitudinal resonance variation is $\Delta R_{xx} = V_{xx}^{Res}/I_{DC}$ where $\Delta V_{xx}^{Res}$ is the voltage change at AFMR after removing the contribution of ISHE signal (as shown in FIG. 20) and $I_{DC}$ is the DC current.

After carefully analyzing the line-shape of the DC voltage signals at QFMR at all temperatures (See Item 3 of the Appendix), both the magnitudes of the AFMR voltage and the main QFMR peak voltage are plotted in FIGS. 3c and 3d. The contrast culminates at low temperatures. Clearly, the ISHE voltage at both resonances disappears far below the Neel temperature of $Cr_2O_3$ crystal (307 K) (18, 19). It can be seen that the EMR signal at AFMR is still observable up to 288 K (see FIG. 16), indicating that the microwave absorption remains active at least up to room temperature. Since the ISHE voltage depends on the efficiency of spin-charge conversion, we believe that the interface quality may be responsible for the disappearance of the ISHE signals at lower temperatures.

The stark contrast in the temperature dependence between the AFMR- and QFMR-induced spin currents indicates that coherent spin pumping alone is inadequate to explain these behaviors. The reasons include (1) no sign change of the spin Hall angle in Pt or Ta versus temperature has ever been reported (7, 8); (2) the absence of sign change for the QFMR further confirms the last point; (3) the spin polarization direction of the resonant mode is fixed and cannot change with temperature. Without being bound by theory, the following picture is proposed to explain the bizarre temperature dependence.

As illustrated in FIG. 1c, while the coherently-driven AFMR selectively excites the RH mode, thermal excitations of incoherent magnons prefer the LH mode which has a lower energy. As a result, thermally-driven LH magnons compete with coherent RH magnons. When the contribution from the former exceeds the latter, it causes a sign change of the total ISHE voltage. Therefore, the sign change strongly suggests rapid thermalization of coherent magnons into incoherent magnons. This process results in an increased effective magnon temperature which in turn raises the lattice temperature via magnon-phonon scattering. In fact, we have indeed observed a temperature rise at AFMR by monitoring the resistance of the Pt-Ta hybrid channel that serves as a sensitive thermometer (See Item 4 of the Appendix). A similar mechanism has recently been proposed for FM spin pumping which can result in resonance induced heating (23, 24).

The increased incoherent magnon population at resonances must be accompanied by an additional spin current flowing across the metal-$Cr_2O_3$ interface, and consequently an additional ISHE voltage of opposite polarity. This process is essentially the same as the spin Seebeck effect (SSE) in which the incoherent magnon diffusion is driven by a temperature gradient.

Figure 4:
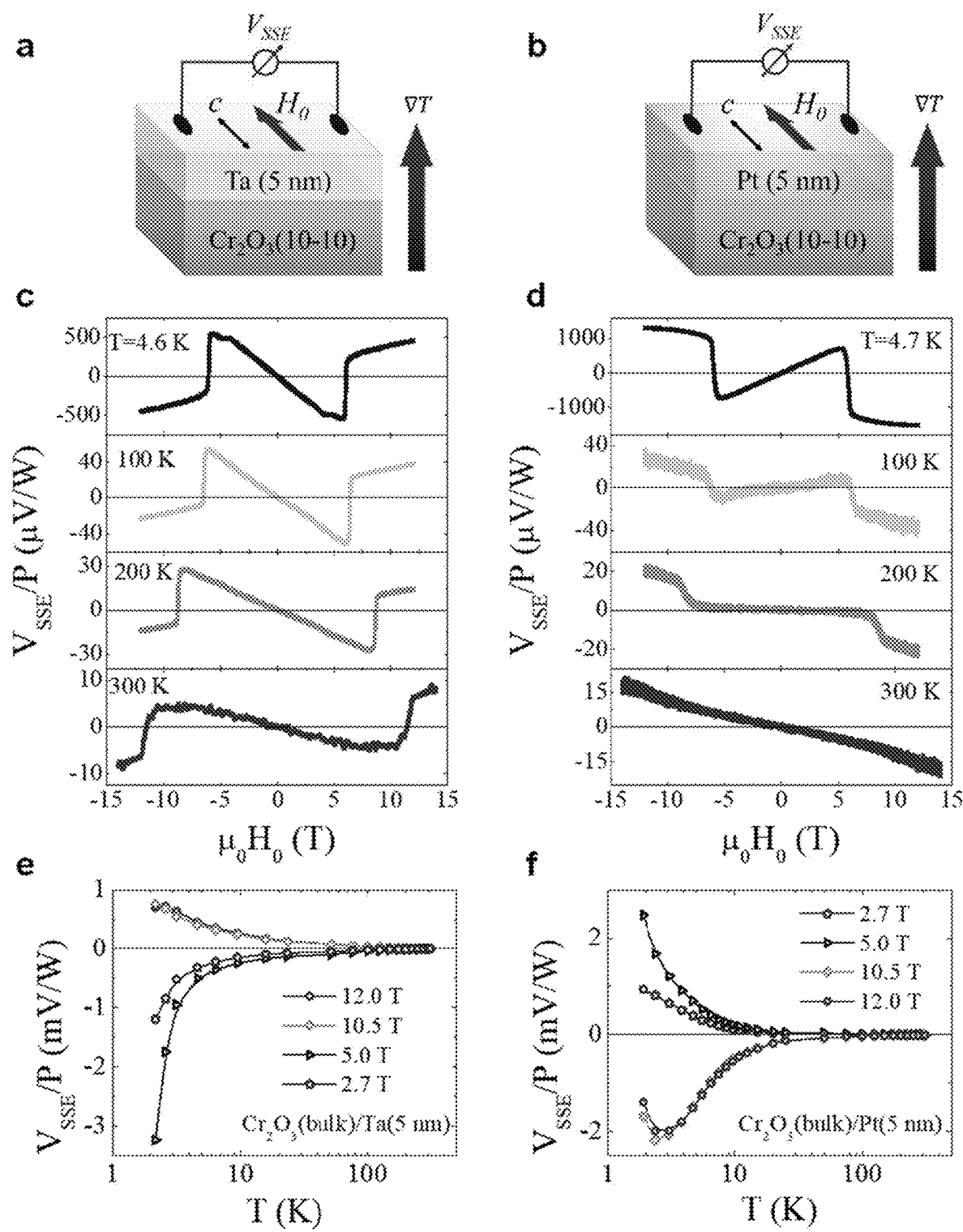
FIG. 4 presents plots illustrating the spin Seebeck effect from incoherent antiferromagnetic Magnons; a and b, schematic diagrams of SSE measurements in $Cr_2O_3(10\bar{1}0)/Ta$ and $Cr_2O_3(10\bar{1}0)/Pt$ heterostructures, respectively. Vertical temperature gradient ∇T is generated by an on-chip heater. Magnetic field $H_0$ is applied in plane and along the c-axis direction. c and d, field dependence of heating-power-normalized SSE signal at 4.6, 100, 200 and 300 K in $Cr_2O_3/Ta$ and $Cr_2O_3/Pt$ heterostructures, respectively. e and f, temperature dependence of heating-power-normalized SSE signal under magnetic fields of 2.7, 5.0, 10.5 and 12 T in $Cr_2O_3/Ta$ and $Cr_2O_3/Pt$ heterostructures, respectively.
Figure 10:
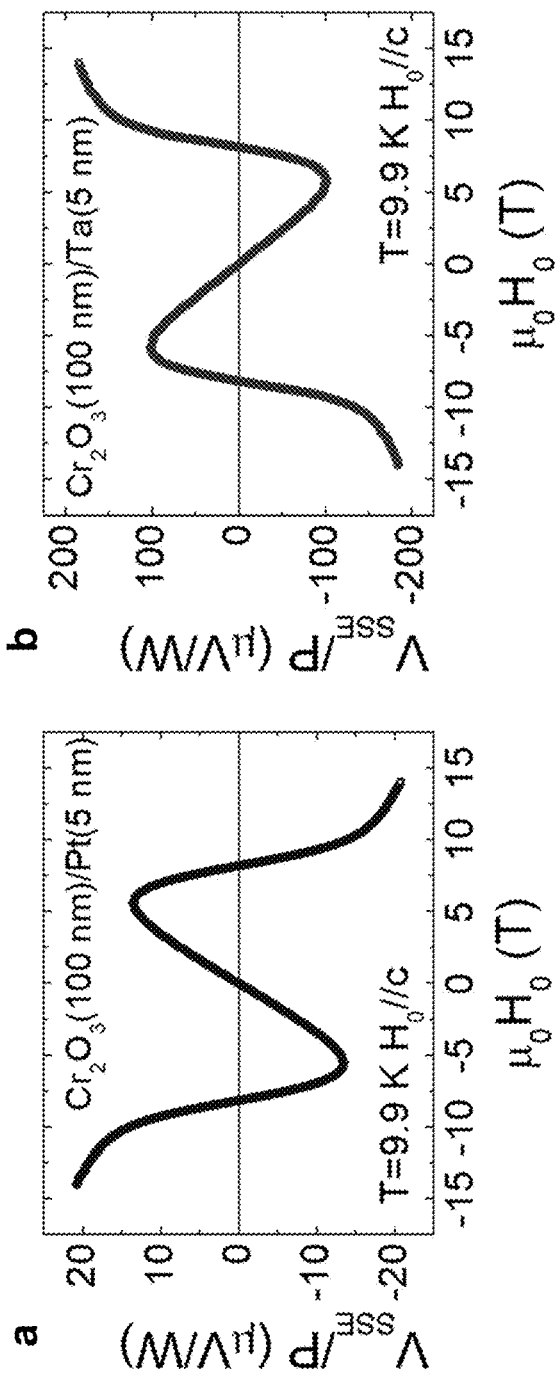
FIG. 10 presents plots of Spin Seebeck effect signal at 9.9 K in $Cr_2O_3$ (100 nm)/Pt (a) and $Cr_2O_3$(100 nm)/Ta (b) heterostructures. $Cr_2O_3$ is (11$\bar{2}$0)-oriented epitaxial thin film deposited on $Al_2O_3$ (11$\bar{2}$0) substrate. The thickness of $Cr_2O_3$ thin film is 100 nm. The magnetic field is applied along the c-axis of $Cr_2O_3$. SSE signal changes the sign across the SF transition, which further confirms that LH magnons (dominating SSE below SF) and RH magnons (dominating SSE above SF) carry opposite angular momenta.
Figure 11:
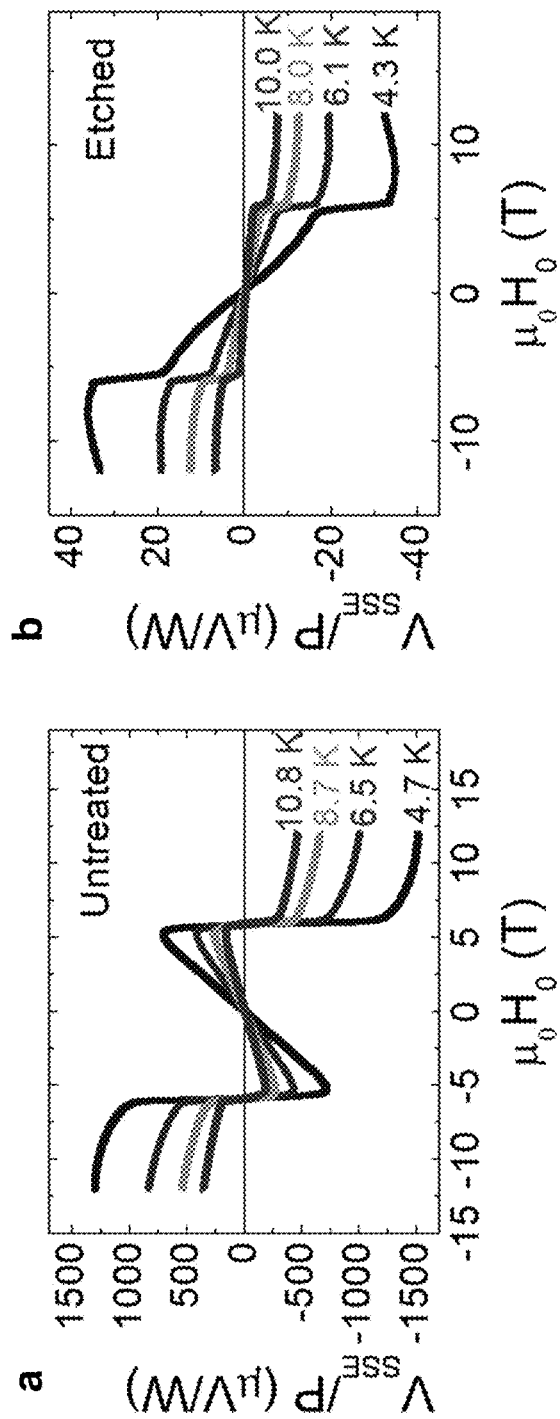
FIG. 11 presents plots of SSE signal in bulk $Cr_2O_3$(10$\bar{1}$0)/Pt with untreated (a) and etched (b) interfaces. For the untreated sample, we anneal the crystal in air using a tube-furnace at 600° C. for 2 hours prior to deposition of the Pt layer. For the etched sample, we first bombard the surface of $Cr_2O_3$ crystal with argon-ion using inductively coupled plasma, and then anneal it in air using tube-furnace at 600° C. for 2 hours before we deposit the Pt layer. The etching process does not affect the sign of the SSE signal above the SF transition; however, it changes sign of the SSE signal below the SF transition. A possible reason is that the etching process may produce some uncompensated magnetic moments at the interface due to different sputtering yields of Cr and O atoms, and these uncompensated magnetic moments also contribute to the SSE signal through modifying the interfacial spin-mixing conductance or directly generating additional spin current. In addition, the etched sample generates much less SSE signal than the untreated sample under the same measurement conditions.

To better understand the incoherent magnon contribution, independent SSE measurements are performed in the same $Cr_2O_3$/Ta and $Cr_2O_3$/Pt heterostructures, where coherent magnons are completely eliminated. As illustrated in FIGS. 4a and 4b, the SSE-induced ISHE voltages are measured by sweeping the magnetic field along the c-axis of the $Cr_2O_3$ crystal under a vertical temperature gradient generated by a heater on top. FIGS. 4c and 4d display the field dependence of the SSE signals in $Cr_2O_3$/Ta and $Cr_2O_3$/Pt, respectively. First of all, there is a large SSE signal at low fields. At 6 T, i.e., the SF field, the SSE voltage undergoes an abrupt jump and switches sign. The sign switch is exactly what is expected from the magnon energy diagram shown in FIG. 1c. Below the SF transition, the LH-magnon branch has a lower energy and thus the total thermal magnon population is dominated by the LH-magnons at low temperatures. Above the SF transition, however, the canted state only supports RH magnons; therefore, the SSE must change sign across the SF transition. The same behavior has also been observed in heterostructures containing epitaxial $Cr_2O_3$ thin films (See FIG. 10). The SSE signal in $Cr_2O_3$/Pt is simply inverted from that in $Cr_2O_3$/Ta for the same reason as in the resonance data. The SSE signal is quite different from what has been reported (25), which might be caused by different $Cr_2O_3$/HM interface properties (as demonstrated in FIG. 11). The temperature dependences of both samples are summarized side-by-side in FIGS. 4e and 4f for magnetic fields below and above the SF transition for temperatures up to 310 K.

Notably, the incoherent magnon contribution to ISHE voltage alone in $Cr_2O_3$ does not cause any sign change, which is different from the behaviors of some ferrimagnets (26, 27) (see Item 5 of the Appendix). As the temperature is decreased, the magnitude of the SSE voltage below the SF field increases precipitously. This trend is the same as the AFMR ISHE voltage. Both can be explained by a decreased equilibrium population of RH magnons. In AFMR, as the temperature is lowered, the increased LH magnon contribution balances out that of the coherently excited RH magnons at ~45 K. In fact, as the temperature is decreased further, the net LH magnon population should reach the maximum, and a SSE voltage peak emerges (28). It occurs approximately at the temperature $T_p$ when $k_B T_p \sim \hbar \omega_m$, here $\omega_m$ being the magnon frequency at zero magnetic field. This overall SSE characteristic has been observed in other uniaxial AFM materials such as $MnF_2$ and $FeF_2$ (29, 30). Compared to these two materials, $Cr_2O_3$ has a lower $\omega_m$; hence, the SSE peak should occur at an even lower $T_p$.

It can be understood that the SSE peak was not captured in the previous experiment because the $T_p$ is outside of their temperature range (25), but appears at ~2.3 K in the instant experiment, as shown in FIGS. 4e and 4f. In principle, the AFMR ISHE voltage would also show a peak if the temperature range extends below the $T_p$ in the instant resonance experiments. The same proposed coherent-to-incoherent magnon thermalization mechanism should also be applicable for QFMR except that both magnons are right-handed. In the case of QFMR, the incoherent magnon contribution should be compared with the SSE voltage above the SF transition as is also shown in FIGS. 4e and 4f.

Figure 12:
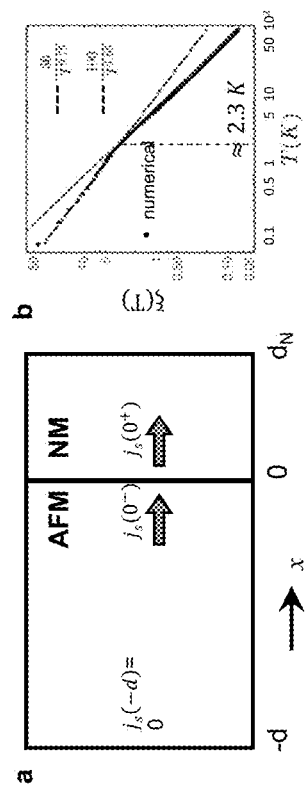
FIG. 12 presents schematic illustrations of device used for theoretical modelling and numerical results of ξ(T). (a) Schematic device geometry for solving the spin diffusion equation [Eq. (S9)] of non-equilibrium incoherent magnons. (b) Numerical plot and fittings of (T). Black dots are numerical calculations based on Eq. (S13). Red and blue dashed lines are power-law fittings for T>2.3 K and T<2.3 K, respectively.

As detailed in Item 6 of the Appendix, the temperature dependence of ISHE voltages are described at both AFMR and QFMR based on a proposed coherent-to-incoherent thermalization mechanism which converts energy from coherent Neel order precession into phase-random thermal magnons. We capture the thermalization process phenomenologically by a temperature dependent parameter $\eta(T)$ as shown in Eqs. (S8) and (S9). It is further assumed that $\eta(T)$ scales as $T^a$ with exponent a obtained from fitting the experimental data. The higher the temperature, the faster incoherent magnons are generated by coherent magnons, which leads to a reduction of coherent spin pumping. On the other hand, the scattering between thermal magnons and phonons also becomes stronger at higher temperatures, which destroys incoherent magnons and eventually transfers energy into phonons. Meanwhile, the net magnon spin current polarization, characterized by $\xi(T)$ which is contained in Eq. (S15), decreases with an increasing T as well (See FIG. 12). These two mechanisms combined result in a significant reduction of incoherent spin current at higher T. While both coherent and incoherent contributions decay with an increasing T, the incoherent contribution varies much faster than the coherent contribution, which explains the cross-over in the AFMR ISHE voltage at about 45 K in our experiments. As shown in FIGS. 3c and 3d, this theory fits the experimental data very well.

In the case of QFMR, coherent and incoherent magnons have the same chirality, so that they generate spin currents with the same polarization; thus, there should be no sign change at any temperature. Similar to the AFMR case, both contributions decrease with an increasing T, thus the total spin current simply exhibits a monotonic decay in T, which agrees with the experimental data in FIG. 3d. We also notice that the situation of QFMR is similar to what happens in FM spin pumping, where the distinction between coherent and incoherent contributions is quite subtle (even controversial) (23, 24). In this regard, we believe that AFM materials provide a unique playground for studying the interplay between coherent and incoherent magnons.

Figure 22:
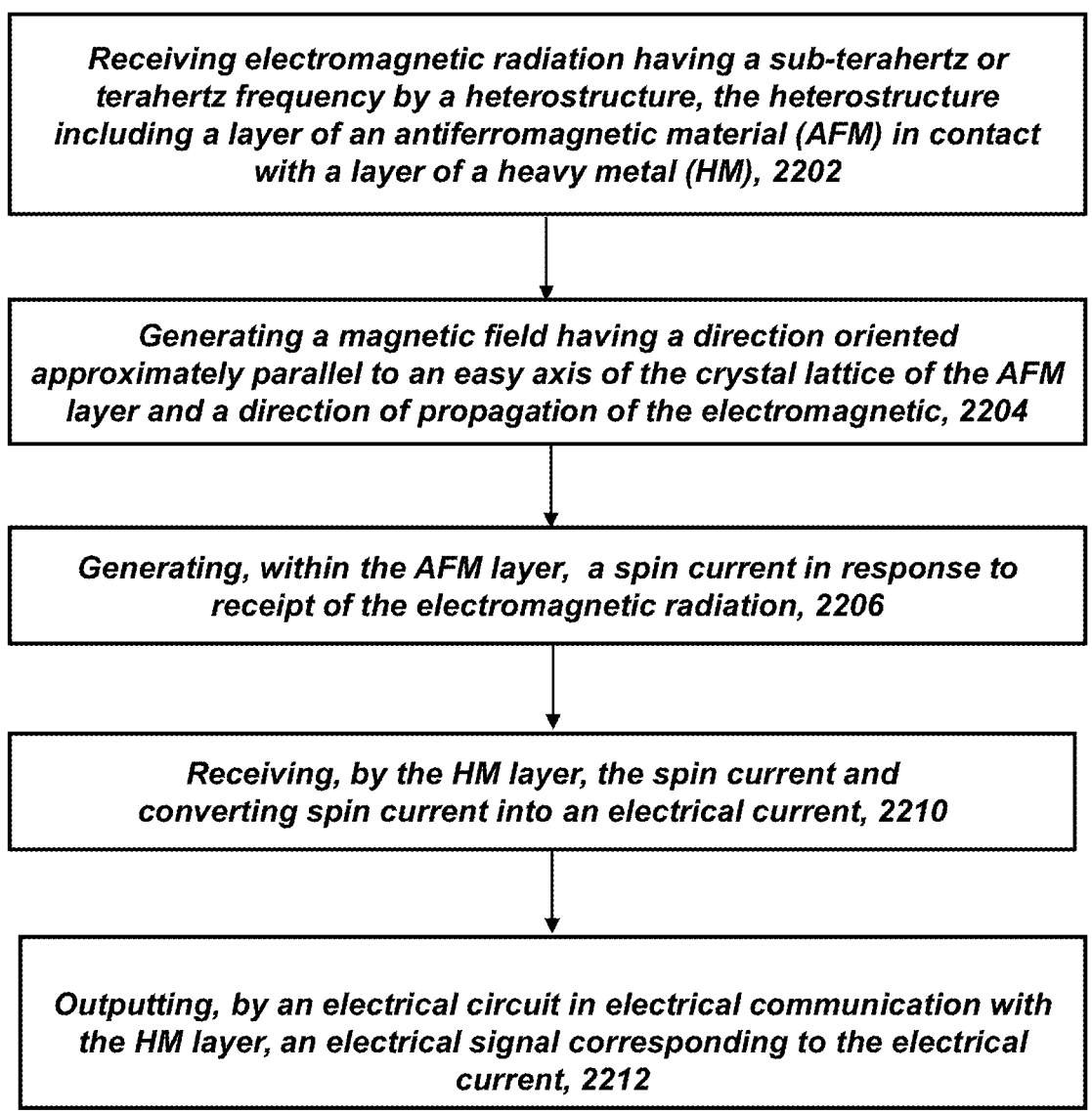
FIG. 22 is a flow diagram illustrating one exemplary embodiment of a method for detecting electromagnetic radiation according to embodiments of the system.

FIG. 22 is a flow diagram illustrating one exemplary embodiment of a method 2200 for detecting electromagnetic radiation employing embodiments of the detector system discussed above. As shown, the method 2200 includes operation 2202-2212. However, in alternative embodiments, the method can include greater or fewer operations than illustrated in FIG. 22 and the operations can be performed in a different order than illustrated.

In operation 2202, electromagnetic radiation having a sub-terahertz or terahertz frequency can be received by a heterostructure. The heterostructure can include a layer of an antiferromagnetic material (AFM) in contact with a layer of a heavy metal (HM).

In operation 2204, a magnetic field can be generated. The magnetic field can have a direction oriented approximately parallel to an easy axis of the crystal lattice of the AFM layer and a direction of propagation of the electromagnetic radiation. As an example, the magnetic field can be generated by an electromagnet, a permanent magnet, a ferromagnetic material, etc.

In operation 2206, a spin current can be generated in the AFM layer in response to receipt of the electromagnetic radiation. The spin current can be injected into the HM layer.

In operation 2210, the HM layer can receive the spin current and generate an electrical current in response to receipt of the spin current.

In operation 2212, an electrical signal corresponding to the electric current can be output. As an example, an electrical circuit can be in electrical communication with the HM layer and the spin current can be converted the electrical current by the inverse spin Hall Effect (ISHE). The electrical signal can characterize the generated electrical current or an open circuit voltage.

In summary, generation and electrical detection of pure spin currents pumped by resonances in uniaxial AFM $Cr_2O_3$ using sub-THz radiation is demonstrated. The ISHE nature of the voltage signals is further confirmed unequivocally. Without being bound by theory, the intriguing temperature dependences of the ISHE voltages at both AFMR and QFMR suggest that coherent and incoherent magnons contribute to the spin current with the latter dominating at low temperatures.

All references throughout this application, for example patent documents including issued or granted patents or equivalents; patent application publications; and non-patent literature documents or other source material; are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference).

The terms and expressions which have been employed herein are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments, exemplary embodiments and optional features, modification and variation of the concepts herein disclosed may be resorted to by those skilled in the art, and that such modifications and variations are considered to be within the scope of this invention as defined by the appended claims. The specific embodiments provided herein are examples of useful embodiments of the present invention and it will be apparent to one skilled in the art that the present invention may be carried out using a large number of variations of the devices, device components, methods steps set forth in the present description. As will be obvious to one of skill in the art, methods and devices useful for the present methods can include a large number of optional composition and processing elements and steps.

All patents and publications mentioned in the specification are indicative of the levels of skill of those skilled in the art to which the invention pertains. References cited herein are incorporated by reference herein in their entirety to indicate the state of the art as of their publication or filing date and it is intended that this information can be employed herein, if needed, to exclude specific embodiments that are in the prior art. For example, when composition of matter are claimed, it should be understood that compounds known and available in the art prior to Applicant's invention, including compounds for which an enabling disclosure is provided in the references cited herein, are not intended to be included in the composition of matter claims herein.

As used herein and in the appended claims, the singular forms "a", "an", and "the" include plural reference unless the context clearly dictates otherwise. Thus, for example, reference to "a cell" includes a plurality of such cells and equivalents thereof known to those skilled in the art, and so forth. As well, the terms "a" (or "an"), "one or more" and "at least one" can be used interchangeably herein. It is also to be noted that the terms "comprising", "including", and "having" can be used interchangeably. The expression "of any of claims XX-YY" (wherein XX and YY refer to claim numbers) is intended to provide a multiple dependent claim in the alternative form, and in some embodiments is interchangeable with the expression "as in any one of claims XX-YY."

Unless defined otherwise, all technical and scientific terms used herein have the same meanings as commonly understood by one of ordinary skill in the art to which this invention belongs. Although any methods and materials similar or equivalent to those described herein can be used in the practice or testing of the present invention, the preferred methods and materials are now described. Nothing herein is to be construed as an admission that the invention is not entitled to antedate such disclosure by virtue of prior invention.

Every formulation or combination of components described or exemplified herein can be used to practice the invention, unless otherwise stated.

Whenever a range is given in the specification, for example, a temperature range, a time range, or a composition or concentration range, all intermediate ranges and sub-ranges, as well as all individual values included in the ranges given are intended to be included in the disclosure. As used herein, ranges specifically include the values provided as endpoint values of the range. For example, a range of 1 to 100 specifically includes the end point values of 1 and 100. It will be understood that any sub-ranges or individual values in a range or sub-range that are included in the description herein can be excluded from the claims herein.

As used herein, the term "comprising" is synonymous with "including," "containing," or "characterized by," and is inclusive or open-ended and does not exclude additional, unrecited elements or method steps. As used herein, the phrase "consisting of" excludes any element, step, or ingredient not specified in the claim element. As used herein, the phrase "consisting essentially of" does not exclude materials or steps that do not materially affect the basic and novel characteristics of the claim. In each instance herein any of the terms "comprising", "consisting essentially of" and "consisting of" may be replaced with either of the other two terms. The embodiments illustratively described herein suitably may be practiced in the absence of any element or elements, limitation or limitations which is not specifically disclosed herein.

One of ordinary skill in the art will appreciate that starting materials, biological materials, reagents, synthetic methods, purification methods, analytical methods, assay methods, and biological methods other than those specifically exemplified can be employed in the practice of the disclosed embodiments without resort to undue experimentation. All art-known functional equivalents, of any such materials and methods are intended to be included in this invention. The terms and expressions which have been employed are used as terms of description and not of limitation, and there is no intention that in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

Methods

Characterization of $Cr_2O_3(10\bar{1}0)$ crystal: $Cr_2O_3$ is a typical uniaxial antiferromagnet with a hexagonal crystal structure and with the magnetic easy axis along the c-axis (See FIG. 5a). The $Cr_2O_3(10\bar{1}0)$ single crystal slab with easy axis (c-axis) in plane was purchased from SurfaceNet GmbH with the dimensions of 5×5×1 mm$^3$. X-ray diffraction (XRD) pattern is acquired with an Empyrean X-Ray Diffractometer with a Cu $K_\alpha$ radiation source. The clear (30$\bar{3}$0) Bragg peak at 2θ~66 (See FIG. 5b) confirms the (10$\bar{1}$0)-orientation of the crystal. The absence of other peaks over a broad range of 2θ (See inset of FIG. 5b) suggests the phase purity of the crystal. Tapping-mode atomic force microscopy (Bruker Dimension, Model 5000) characterization (See FIG. 5c) is performed on the polished surface of the $Cr_2O_3$ (10$\bar{1}$0) crystal. The root-mean-square roughness over a 1 μm×1 μm area is less than 0.1 nm. A clean and smooth interface is crucial to observe the spin-pumping signal in our experiments.

Measurement geometry of antiferromagnetic spin pumping: In the antiferromagnetic spin pumping experiments, the sample is secured to sapphire piece and mounted on a Teflon stage at the exit of the waveguide. The c-axis of the $Cr_2O_3$ (10$\bar{1}$0) crystal, the propagation direction of 0.240 THz microwaves, and the external magnetic fields are all along the same direction.

Figure 7:
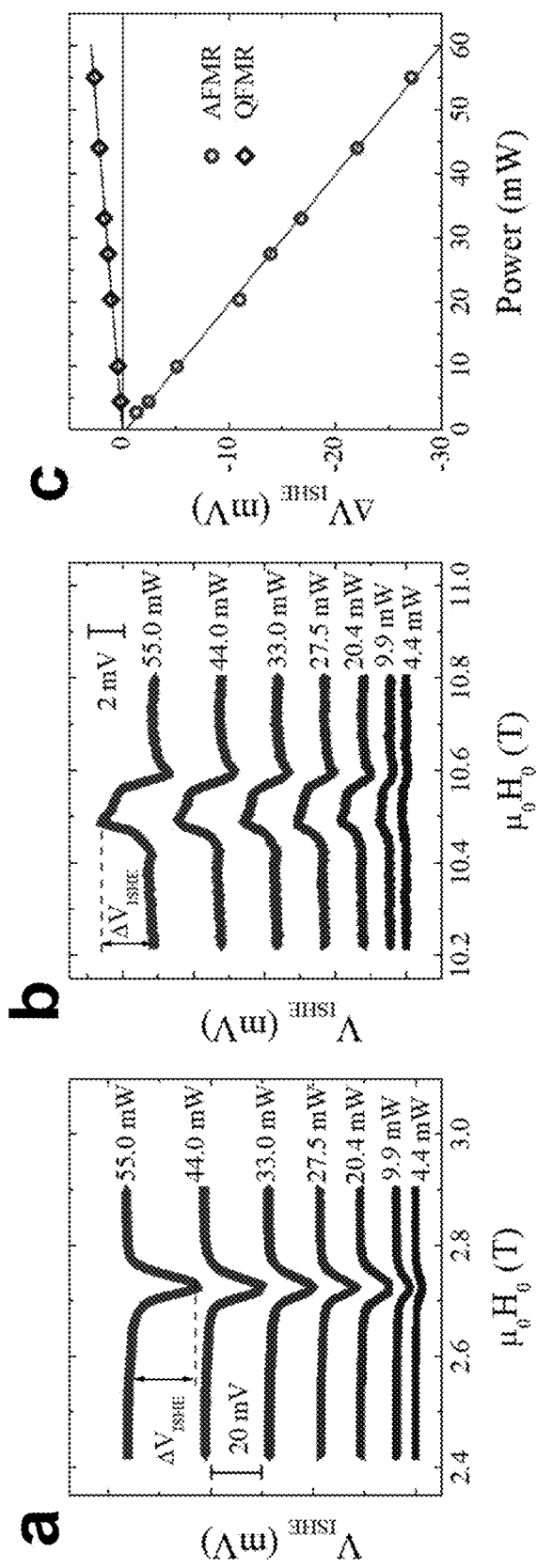
FIG. 7 are plots illustrating the linear microwave power dependence of ISHE signals at 10 K. a, Field dependence of ISHE signal at AFMR under different microwave powers. b, Field dependence of ISHE signal at QFMR under different microwave powers. c, Microwave power dependence of ISHE signal magnitude at both AFMR and QFMR. $\Delta V_{ISHE}$ is defined in a and b.

For electrical detection, pattern eight Pt strips and eight Ta strips are patterned alternately on the polished surface of the Cr$_2$O$_3$(10$\bar{1}$0) crystal perpendicular to the c-axis of Cr$_2$O$_3$. All parallel strips have the same lateral dimensions of 50 μm×3.5 mm and thickness of 5 nm. Each of the independent strips produces an emf like a battery due to the ISHE during spin-pumping experiments, but the ISHE voltages from Pt and Ta strips have opposite polarities due to their opposite spin Hall angles. To maximize the ISHE signals, these individual "batteries" are in series, i.e., positive terminal to negative terminal, to produce a large sum signal. As depicted in FIG. 7, three detection geometries are available to probe the ISHE signals from Pt-only, Ta-only and Pt-Ta hybrid channels. By using multiple strips in each geometry, ISHE voltage can be effectively multiplied. In addition, a signal preamplifier SR560 is used to amplify the voltage signals, and the gain is set to 5000 in all voltage measurements.

Spin Seebeck effect measurements: To form Cr$_2$O$_3$/Pt(Ta) heterostructures for SSE measurements, 5 nm Pt(Ta) is directly deposited on top of Cr$_2$O$_3$(10$\bar{1}$0) crystal with magnetron sputtering and patterned into a Hall bar with dimensions of 200 μm×2740 μm perpendicular to the c-axis. Then an 80 nm Al$_2$O$_3$ insulating layer is deposited by atomic layer deposition, followed by Cr(45 nm)/Au(5 nm) films covering the Hall bar channel area as a heater. In the SSE experiment, an AC current is applied to the Cr/Au heater to generate a vertical temperature gradient across the interface and the double-frequency voltage response along the Pt(Ta) Hall bar channel is recorded as the spin Seebeck signal V$_{SSE}$ using standard lock-in technique. Frequency of the AC current is set at 13 Hz. An external magnetic field is applied in-plane along the easy axis of Cr$_2$O$_3$, i.e., [0001] or the c-axis during SSE measurements. The SSE voltages are normalized by the heating power in order to draw meaningful comparisons among different measurement conditions.

APPENDIX

1. Electron Magnetic Resonance (EMR) and Spin Pumping (SP) Signals in Cr$_2$O$_3$ Crystal Up to 288 K A. The Evolution of EMR and SP Signal as a Function of Temperature The magnetic resonance fields of the Cr$_2$O$_3$ crystal in 0.240 THz are investigated via both electron paramagnetic resonance (EMR) and voltage measurements. As described in the Methods section above, in most cases, the EMR and voltage signals are measured using the standard lock-in technique while modulating the microwave power with a frequency of 13 Hz. At 250 K and 288 K, we also measure EMR signals by modulating the magnetic field intensity via a small induction coil with a frequency of 20 kHz and a magnitude of 0.1-0.3 mT. The DC magnetic fields up to 12.0 T are provided by a superconducting magnet.

Figure 13:
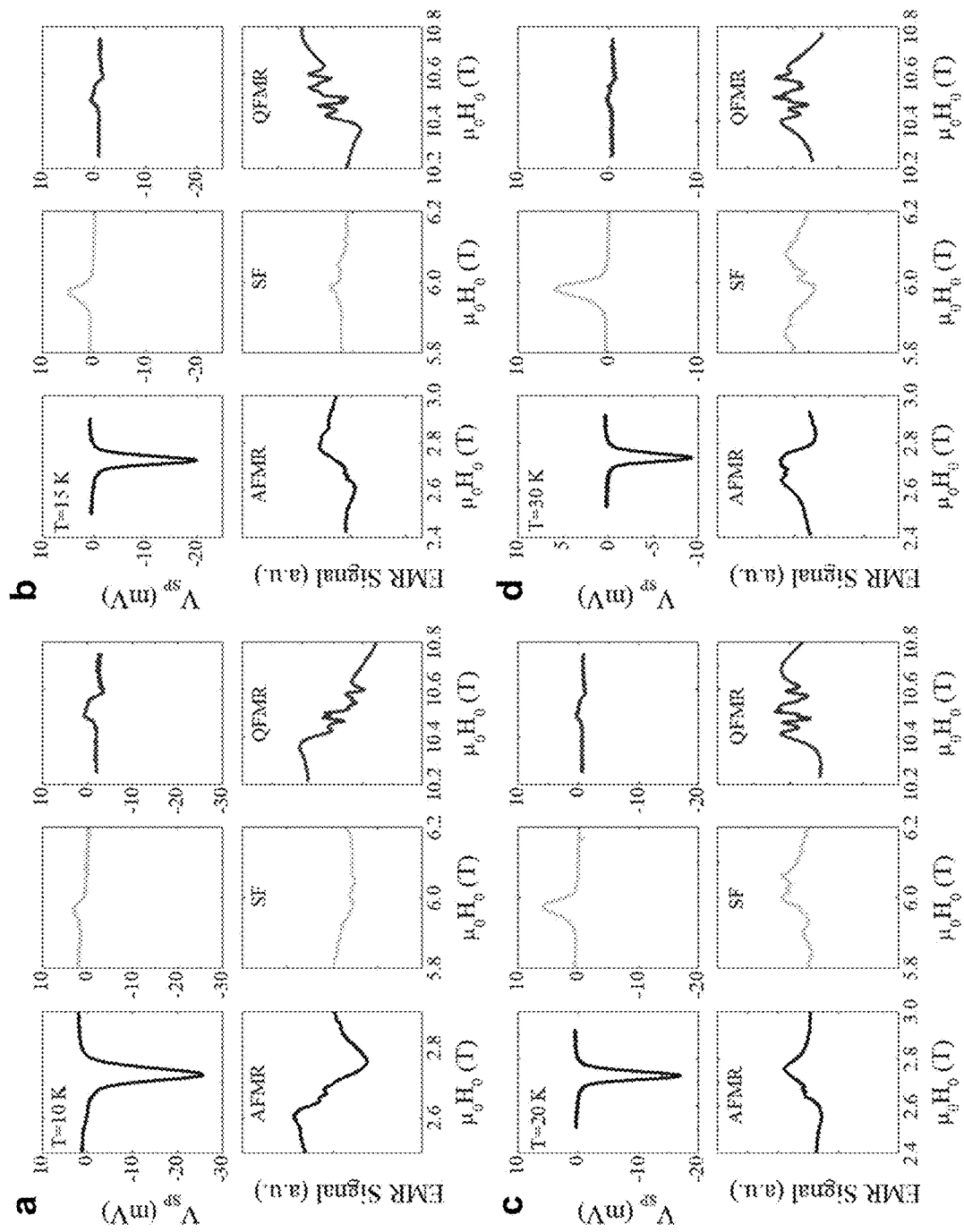
FIG. 13 presents plots of EMR and SP voltage signals in $Cr_2O_3$ crystal at 10 K (a), 15 K (b), 20 K (c), and 30 K (d). EMR and voltage signals at antiferromagnetic resonance (AFMR), spin-flop (SF) transition and quasi-ferromagnetic resonance (QFMR) are presented for each temperature. We modulate the intensity of the microwave source and measure the EMR and voltage signals via the standard lock-in technique. The magnetic field is applied along the c-axis of $Cr_2O_3$.
Figure 14:
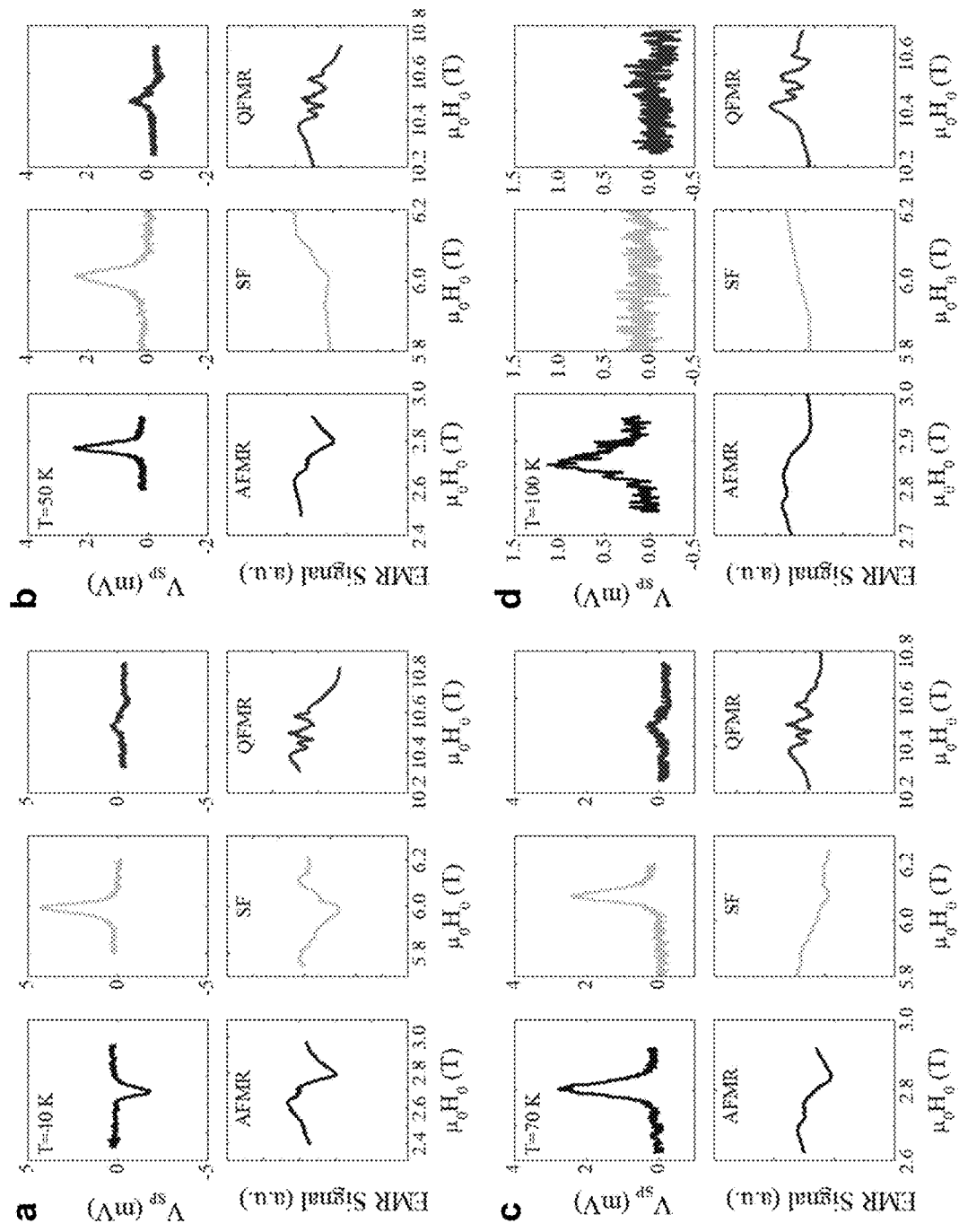
FIG. 14 presents plots of EMR and SP voltage signals in $Cr_2O_3$ crystal at 40 K (a), 50 K (b), 70 K (c), and 100 K (d). EMR and voltage signals at AFMR, SF transition and QFMR are presented at different temperatures. The intensity of the microwave source is modulated and the EMR and ISHE signals are measured by the standard lock-in technique. The magnetic field is applied along the c-axis of $Cr_2O_3$.
Figure 15:
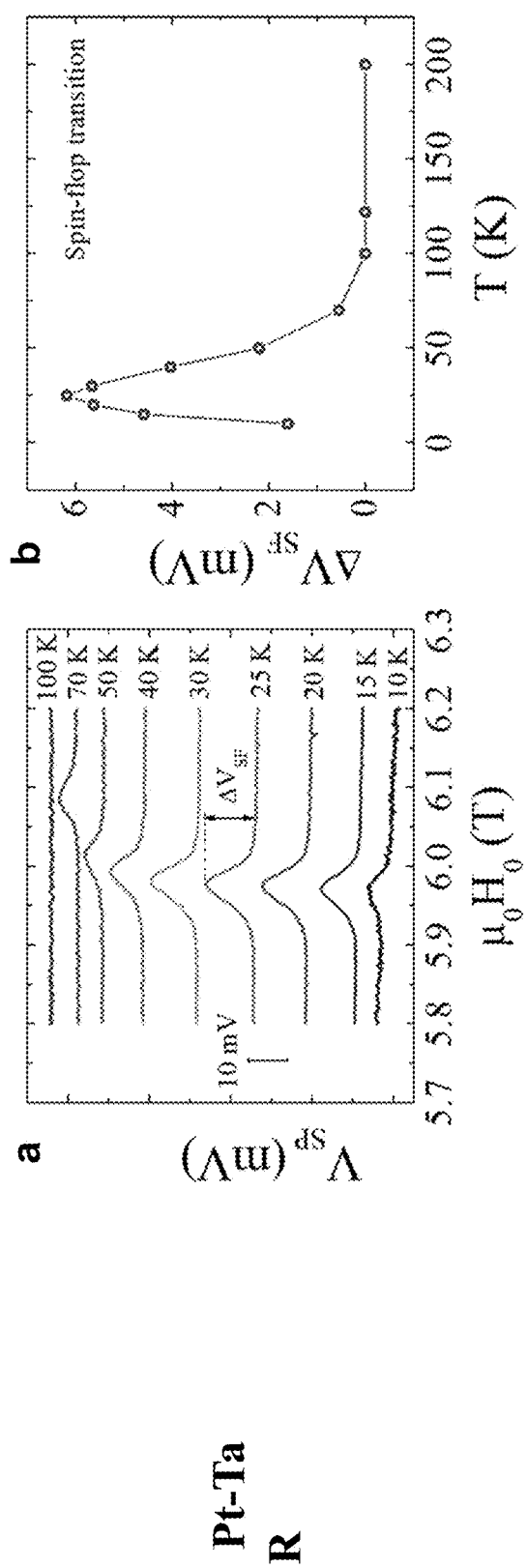
FIG. 15 presents plots of voltage signals at the spin-flop transition. a, Voltage signals as a function of magnetic field at temperatures from 10 K to 100 K. $H_{Res}$ is the magnetic resonance field and $H_0$ is the external magnetic field. $\Delta_{VSF}$ is the difference between voltage signals at the resonance field and far away from the resonance. b, Temperature dependence of $\Delta_{VSF}$. The power of microwave excitation is 55 mW.

As discussed above, the magnetic resonances in Cr$_2$O$_3$ crystal are expected to occur at 2.7 T (AFMR) and 10.5 T (QFMR) in 0.240 THz microwaves at low temperatures. Besides AFMR and QFMR features, however, a small EMR feature also appears at the spin-flop (SF) transition (~6 T). Only in ideal cases when the applied field is perfectly aligned with the easy axis, the upper right-hand (RH) magnon branch of the magnon frequency diagram as shown in FIG. 1c abruptly stops at the SF transition. However, in practical experimental situations, due to unavoidable field misalignment or formation of SF domains, the upper branch comes down over a very narrow field range at the SF field and smoothly joins the QFMR branch (1); therefore, it always intercepts with the 0.240 THz line around the SF transition and gives rise to a magnetic resonance. This is the middle resonance peak at about 6 T. EMR and voltage signals over the full field range scan show no other resonances except at AFMR, SF transition, and QFMR as shown in FIG. 13 and FIG. 14 at the selected temperatures. First, EMR signals at AFMR and QFMR coincide with the spin pumping voltage signals at the same resonance field positions. Although the line-shape of the EMR signals is somewhat more complicated, the ISHE voltage features have a much better-defined line profile, which makes the electrical detection a more sensitive tool to prove the magnetic resonances over the sub-THz to THz frequency range. Second, there is also a voltage peak at the SF transition up to 70 K (see FIGS. 13-15), which has the same sign as the main voltage peak at QFMR. Since the field misalignment also produces a net magnetic moment just as in the QFMR case, both the SF resonance and QFMR are caused by the RH spin precession, which explains the sign of the SF resonance. As shown in FIG. 15, the voltage signal at the SF transition Δ$_{VSF}$ first increases as the temperature increases, reaches a maximum around 25 K, then it starts to decrease and finally vanishes at 100 K.

It is shown that, although the voltage signals vanish above 120 K, the EMR signals are still observable up to 288 K. As an example, EMR signals at 125, 200, 250, and 288 K are plotted in FIG. 16. The presence of the AFMR feature at 288 K detected by EMR indicates that coherent k=0 magnon precession persists up to room temperature. Therefore, we attribute the vanished ISHE signals above 120 K to the spin memory loss occurring at the interface possibly due to imperfection or magnetic impurities. We expect to improve the spin-charge conversion efficiency at higher temperatures by refining interface quality such as high temperature annealing in the environment of oxygen to remove oxygen deficiencies or inserting a thin epitaxial Cr$_2$O$_3$ layer between the crystal and the heavy metal to improve the interface smoothness.

B. Magnetic Resonance Fields of Cr$_2$O$_3$ Crystal as a Function of Temperature Below the SF transition, the AFMR frequency can be expressed as (2-4)

$$\frac{\omega}{\gamma} = \sqrt{2H_A H_E + \left(\frac{\alpha}{2}H_0\right)^2} \mp H_0\left(1 - \frac{\alpha}{2}\right) \tag{S1}$$

where H$_E$ and H$_A$ are the effective fields of the inter-sublattice exchange and single ion anisotropy, respectively. γ=(gμ$_B$)/h is the gyromagnetic ratio, g is the Lande-factor, and μ$_B$ is he Bohr magneton, and α=χ$_\parallel$/χ$^\perp$ the ratio of the magnetic susceptibilities between the parallel and perpendicular directions. a is a temperature-dependent parameter, which starts from 0 at low temperatures, slowly increases until finally reaches 1 near the Neel temperature of Cr$_2$O$_3$ (307 K) (2, 5). At the same time, H$_E$ and H$_A$ also change with temperature (2). With the assumption of H$_E$>>H$_A$, which is valid for Cr$_2$O$_3$, the resonance field of AFMR can be expressed as $$H_{AFMR} = \frac{\frac{\omega}{\gamma} - \sqrt{2H_A H_E}}{1 - \frac{\alpha}{2}}. \tag{S2}$$

The SF transition is a result of competition between exchange $H_E$, anisotropy $H_A$, and Zeeman energy, and the SF field can be written as $$H_{SF} = \frac{\sqrt{2H_A H_E}}{\sqrt{1-\alpha}}. \quad (S3)$$

Above the SF transition, QFMR can be treated as the resonant precession of the field-induced net magnetic moment with respect to the external magnetic field, and the resonance field of QFMR is $$H_{QFMR} = \sqrt{2H_A H_E + \left(\frac{\omega}{\gamma}\right)^2}. \quad (S4)$$

Combining Eqs. (S2)-(S4). we can calculate the resonance fields for a certain ω with the information of a and $2H_A H_E$, of the material. We replot the T-dependence of α and $\sqrt{2H_A H_E}$, of $Cr_2O_3$ crystal from ref. 2 in FIGS. S5a and S5b. By taking γ=28 GHz/T (g=2), we calculate the resonance fields of AFMR, SF resonance and QFMR of $Cr_2O_3$ for of 0.240 THz (FIG. S5c). At the same time, we experimentally determine the resonance fields for AFMR, SF and QFMR of $Cr_2O_3$ crystal from the combination of EMR and ISHE signals, as depicted in FIG. S5d. We can clearly see that the calculation and experimental results agree with each other very well. Here are some common interesting features. First, the QFMR field has very weak T-dependence below 200 K. The calculated QFMR field starts to decrease above 200 K and crosses the SF field at 250 K. Since the QFMR occurs after the SF transition, it means that the QFMR is not observable above 250 K, which explains the absence of QFMR in EMR at 250 K and 288 K (see FIG. S4 and S4d). Second. the increasing SF field is mainly caused by the increasing trend of a at high temperatures, not by the T-dependence of $\sqrt{2H_A H_E}$ (FIG. S5b). Third, the T-dependence of the AFMR field is determined jointly by the T-dependence of both $\sqrt{2H_A H_E}$ and a as indicated by Eq. (S2).

2. Inverse Spin Hall Effect (ISHE) Voltage Signals Detected with Pt-Ta Hybrid Channel and Ta-Only Channel The magnitude of the spin pumping voltage signal is proportional to the resistance of the detection layer. The resistances of Pt, Ta, and Pt-Ta hybrid channels at 5 K and 60 K are summarized under the magnetic field of 2.4 T in Table I. The resistance of the Ta-channel is 15.5 (14.1) times larger than that of the Pt channel at 5 K (60 K), and the resistance of the Ta channel is ~93% of that of the hybrid channel. If we assume that the $Cr_2O_3$/Pt and $Cr_2O_3$/Ta interfaces have the same spin-mixing conductance, we expect the voltage signal in the Ta channel to be 93% of that in the hybrid channel. FIG. S6 plots the voltage signal at AFMR for the hybrid and Ta channels at 5 K, 30 K, and 60 K. The voltage signal from the Ta channel is only 62-80% of that from the hybrid channel, which is slightly lower than the expected value. The difference could be due to the different spin-mixing conductance at the interface between $Cr_2O_3$ and the heavy metal. It suggests that the interface of $Cr_2O_3$/Pt has a higher spin-mixing conductance than that of the $Cr_2O_3$/Ta interface.

TABLE I

The resistance of Pt, Ta (β-phase), and Pt—Ta hybrid channels at 5K and 60K. The magnetic field is 2.4 T, under which the $Cr_2O_3$ crystal is not in a resonance state.

| Detection channel | (T = 5K) | (T = 60K) |
|---|---|---|
| Pt channel | 16.284 | 17.523 |
| —Ta channel | 251.915 | 246.514 |
| Pt—Ta hybrid channel | 268.732 | 264.563 |

3. Analysis of Line-Profile of ISHE Voltage Signals at Quasi-Ferromagnetic Resonance (QFMR)

Here we show our line-shape analysis of the voltage signals at QFMR. For the 5 K data shown in blue in FIG. S7, it is obvious that one has to use more than one peak to describe the QFMR voltage signal. In fact, because of the broadened QFMR data below 60 K, we apply the same procedure to all spectra. Here is how we analyze the data. We decompose the total signal V into two parts: $V=V_{Res}^1 + V_{Res}^2$, where $V_{Res}^1$ and $V_{Res}^2$ are voltage signals generated by resonances 1 and 2, respectively. First, we try to fit the experimental data using a combination of two Lorentzian functions with opposite signs, $$V = S_1 \frac{\Delta H_1^2}{\Delta H_1^2 + (H_0 - H_{R1})^2} - S_2 \frac{\Delta H_2^2}{\Delta H_2^2 + (H_0 - H_{R2})^2}, \quad (S5)$$

where $\Delta H_i$ and $H_{Ri}$ are the linewidth and the resonance field, respectively. $S_1$ and $S_2$ are the magnitudes of the resonance peaks at $H_{R1}$ and $H_{R2}$ respectively. As shown in FIG. S7a, although the fit captures the dip relatively well, it fails to describe the main peak and the plateau on top of the peak. Moreover, introducing a negative ISHE resonance signal (red curve in FIG. S7b) in Eq. (S5) poses a conceptual difficulty because the QFMR is generated by a field-induced magnetic moment which should have positive ISHE signals at both resonance fields.

Considering the microwave rectification effect (6,7) due to some magnetoresistance effect such as the spin Hall magnetoresistance (SMR) (8), we found that the QFMR voltage signal can be reproduced very well with the following equation (as shown in FIG. S7c), $$V = S_1 \frac{\Delta H_1^2}{\Delta H_1^2 + (H_0 - H_{R1})^2} + \\ S_2 \frac{\Delta H_2^2}{\Delta H_2^2 + (H_0 - H_{R2})^2} + A_2 \frac{\Delta H_2(H_0 - H_{R2})}{\Delta H_2^2 + (H_0 - H_{R2})^2}, \quad (S6)$$

where the last term describes the antisymmetric line shape at the second resonance. As shown in FIG. S7d, the second resonance is dominated by the antisymmetric signal (green curve) originated from the microwave rectification effect at $H_{R2}$. In general, the line shape of the rectification effect is related to the phase difference between magnetic and electric components of the microwave fields in the material (6, 7). We attribute the less than 1% difference between the two resonance fields to small variations in antiferromagnetic properties such as magnetic anisotropy from different regions of the sample. We can also extract the magnitude of the QFMR signal through a direct readout of the peak height $\Delta V_{ISHE}$ (FIG. S7c) from the experimental data. FIG. S7e presents the temperature dependence of $\Delta V_{ISHE}$ and $S_1$ (defined in FIG. S7d). These two sets of data essentially fall on top of each other. As shown in FIG. 3d, the solid lines are the fits for $\Delta V_{ISHE}$ and $S_1$, both of which can be well fitted by our phenomenological model.

4. Heating-Induced Resistance Change at Antiferromagnetic Resonance (AFMR)

The heating effect in FMR experiments was reported in the 1980's (9) and has been revisited recently in ferromagnetic spin pumping experiments (10-12). Here we demonstrate that similar heating effect also exists in antiferromagnetic spin pumping experiments. We use the resistance of the Pt-Ta hybrid channel as a thermometer to monitor the heating effect at AFMR. A 1 pA DC current is applied to the channel and the voltage along the detection channel is measured as a function of the external magnetic field under the 0.240 THz microwaves. FIG. S5a plots the magnetic field dependence of the total voltage at 5 K which shows a clear dip at AFMR. In fact, the voltage drop in FIG. S8a is a mixture of $\Delta V_{xx}^{Res}(=I_{DC}R_{xx})$ caused by the resistance change ($\Delta R_{xx}$) and the spin pumping signal $V_{SP}^0$, in the absence of the DC current (as shown in FIG. S8b), here $V_{SP}^0$ being the raw spin pumping signal without the 5000 amplification, since we do not use the preamplifier for resistance measurements. We can clearly see that $V_{SP}^0$ is much smaller than the total voltage signal $\Delta V_{mix}$. We extract the peak value of $\Delta V_{mix}$ and $V_{SP}^0$ (as defined in FIG. S8a and S8b) and plot them as functions of temperature in FIG. S8c. After subtracting the $V_{SP}^0$ contribution from $\Delta V_{mix}$, we obtain the voltage signal $\Delta V_{xx}^{Res}$, which is associated with the heating-induced resistance change ($\Delta V_{xx}^{Res}=I_{DC}\Delta R_{xx}$). Clearly, the magnitude of $\Delta R_{xx}$ increases rapidly at low temperatures.

In order to estimate the heating-induced temperature rise, we use the heavy metal detector as a resistive thermometer and monitor its resistance change. As shown in FIG. S9a, the resistance of the Pt-Ta hybrid channel is dominated by the resistance from β-phase Ta, which increase with a decreasing temperature. With the temperature derivative of the channel resistance $dR_{xx}/dT$ (FIG. S9b) measured in the absence of any microwaves and the heating-induced resistance change $\Delta R_{xx}$ (as shown in FIG. S9c), we estimate the microwave heating-induced temperature change using $$\Delta T = \frac{\Delta R_{xx}}{dR_{xx}/dT}.$$

As summarized in FIG. S9d, $\Delta T$ is ~0.15 K at 5 K. As the system temperature increases, $\Delta T$ first increases, peaks at 35 K with the maximum value of 0.23 K, and then slowly decreases. The peculiar temperature dependence of $\Delta T$ may be related to the heat capacity of the $Cr_2O_3$ crystal. The temperature rise at AFMR provides direct evidence of the lattice heating effect under the resonance condition in $Cr_2O_3$, which is caused by coherent-incoherent magnon thermalization, and then magnon-phonon scattering to transfer energy from the spin system to lattice.

5. Discussion of Spin Seebeck Effects in Compensated Ferrimagnets and Antiferromagnetic $Cr_2O_3$ Here we show that the temperature dependence of the spin Seebeck effect (SSE) signal in compensated ferrimagnets is profoundly different from that in antiferromagnetic $Cr_2O_3$. In compensated ferrimagnets, SSE sign is complicated by several factors that can change as the temperature is varied (13-15). Two sign changes in SSE have been observed in rear-earth iron garnet (RelG)/heavy metal heterostructures (14, 15). The high-temperature sign change happens at the magnetic compensation temperature $T_{comp}$, which is due to the reversal of the sublattice spins and therefore the magnon spin current polarization. This sign change temperature is solely a property of the RelG and insensitive to the detection layer or interface (15). The low-temperature sign change happens at $T_{sign,2}$ and is attributed to the temperature-dependent competition between two bulk magnon modes in the garnet, namely, a gapless acoustic-like mode and a gapped optical-like mode (14). These two modes carry opposite angular momenta. As the temperature varies across $T_{sign,2}$ from below, the low-lying acoustic-like magnon mode first dominates SSE but gives place to the gapped optical-like mode at $T>T_{sign,2}$ due to the reduced magnon gap at the Γ point.

Now let us consider $Cr_2O_3$. As we explained above, the sign change of SSE at $T_{comp}$ is clear irrelevant simply because there is no magnetic compensation phenomenon in antiferromagnetic $Cr_2O_3$. The second sign change at $T_{sign,2}$ in ferrimagnetic garnet is not applicable to $Cr_2O_3$ either. In fact, the magnon band structure for uniaxial antiferromagnets such as $Cr_2O_3$ is much simpler. There is a gap at k=0 under zero magnetic field, $E_g=\gamma\sqrt{2H_EH_A}$, where γ is the gyromagnetic ratio, $H_E$ and $H_A$ are effective fields of inter-sublattice exchange coupling and magnetic anisotropy, respectively. The degeneracy of the magnon energy is lifted under magnetic field $H_0$ applied along the c-axis, and the energies at the Γ point of the two branches are given by $E_n=\gamma\sqrt{2H_EH_A}\pm\gamma H_0$, which are nearly constant below 200 K at a given field (2) (also see FIG. S5b). Hence, no SSE sign change is expected in $Cr_2O_3$ from the mechanism proposed for RelG. As we explained in the main text, the SSE signal in $Cr_2O_3$ is dominated by the LH magnons below the SF transition, so that no SSE sign change is expected in the antiferromagnetic magnon scenario. Experimentally, we did not find any sign change in SSE of $Cr_2O_3$/Pt and $Cr_2O_3$/Ta below 175 K (FIG. 4 and Extended Data FIG. 6), which provide direct evidence for AFM magnon picture. Above all, we conclude that the ISHE voltage sign change at 45 K observed at AFMR in $Cr_2O_3$ could not be explained by its SSE, one must include coherently excited right-handed magnons to properly interpret the experimental results, as what we proposed in the manuscript.

6. Theory of Coherent and Incoherent Magnon Spin Currents

Theoretical modeling: We attribute the observed sign change of the pumped spin current to the competition between coherent and incoherent magnons, as they have opposite spin polarizations. Coherent magnons refer to the particular mode of k=0 and frequency $$\frac{\omega_0}{2\pi} = 0.240 \text{ THz}$$

in the upper branch (i.e., the AFMR mode), which is driven directly by the microwaves. In contrast. incoherent magnons are thermal excitations spanning all k's in the Brillouin zone; they are phase random and uncorrelated. The coherent spin dynamics can initiate incoherent magnons by virtue of nonlinear effects (e.g., large angle precession at resonance), which redistribute energy among different magnon modes (i.e., magnon thermalization) without necessarily involving phonons. Phenomenologically, we can model the generation of incoherent magnons as a heating process: the AFMR raises the temperature of thermal magnons, resulting in an excessive thermal magnon density traveling towards the Cr$_2$O$_3$/HM interface, hence a thermally-driven spin injection into the HM layer similar to the SSE.

We adopt a two-fluid model to describe the coupled dynamics of coherent and incoherent magnons. The volume of coherent magnons at k=0 is $$N_0 = \frac{1}{a^3}\langle \hat{c}_{0\downarrow}^+ \hat{c}_{0\downarrow}\rangle,$$

where a is the lattice constant (cubic lattice for simplicity), $\langle \ldots \rangle$ denotes the quantum average, and $\hat{c}_{0\downarrow}^+$ ($\hat{c}_{0\downarrow}$) is the creation (annihilation) operator of the AFMR mode with spin-down polarization (RH chirality). Similarly, the volume density of incoherent magnons is $$N_{th} = \sum_{\sigma=\uparrow,\downarrow} \int \frac{d^3 k}{(2\pi)^3} \langle \hat{c}_{k\sigma}^+ \hat{c}_{k\sigma}\rangle_T,$$

where $\langle \ldots \rangle_T$ denotes thermal average. At thermal equilibrium (i.e., without microwave drive), $$\langle \hat{c}_{k\sigma}^+ \hat{c}_{k\sigma}\rangle_T = \bar{n}(\varepsilon_{k\sigma}) = \frac{1}{e^{\varepsilon_{k\sigma}/k_B T}-1},$$

where $\varepsilon_{k\pm}=\hbar\omega_{k\pm}^* = \hbar\sqrt{\omega_m^2+c^2 k^2}\pm\gamma B$ is the dispersion relation, $$\frac{\omega_m}{2\pi} = 0.165$$

THz the magnon gap, c the spin wave velocity, B=2.7 T the magnetic field. and $\gamma$ the gyromagnetic ratio. At AFMR, coherent magnons heat up incoherent magnons such that $$\langle \hat{c}_{k\sigma}^+ \hat{c}_{k\sigma}\rangle_T = \frac{1}{e^{\varepsilon_{k\sigma}/k_B(T+\Delta T)}-1} \approx \bar{n}(\varepsilon_{k\sigma}) + \frac{\partial \bar{n}(\varepsilon_{k\sigma})}{\partial T}\Delta T,$$

thus the non-equilibrium part of incoherent magnons has a volume density of $$n_{th} = \frac{\partial N_{th}(T+\Delta T)}{\partial T}\Delta T = \sum_{\sigma=\uparrow,\downarrow} \int \frac{d^3 k}{(2\pi)^3} \frac{\partial \bar{n}(\varepsilon_{k\sigma})}{\partial T}\Delta T. \quad (S7)$$

Since the AFM is very thick (1 mm), $\Delta T = \Delta T(x)$ can smoothly vary over space so that incoherent magnons diffuse in the thickness direction. Suppose that the absorbed driving power of the microwaves at AFMR is F, then the governing equations of magnons are $$\frac{dN_0}{dt} = \frac{F}{V} - \alpha\omega_0 N_0 - \eta\omega_0 N_0, \quad (S8)$$

$$\frac{\partial n_{th}}{\partial t} - D\frac{\partial^2 n_{th}}{\partial x^2} = -\frac{n_{th}}{\tau_p} + \eta\omega_0 N_0, \quad (S9)$$

where $\alpha$ is the Gilbert damping, D is the spin diffusion constant, and $\tau_p$ is the spin relaxation time determined by magnon-phonon scattering. In the last term, $\eta=\eta(T)$ characterizes the production rate of incoherent magnons from coherent magnons. We emphasize that the $\eta$ term only converts energy from coherent spin dynamics into incoherent magnons. It does not cause the overall energy loss of the spin degree of freedom because $d(N_0+n_{th})/dt$ is independent of $\eta$. When a steady state is achieved, $$\frac{dN_0}{dt} = 0, \text{ thus } N_0 = \frac{F}{V\omega_0(\alpha+\eta)}.$$

The spin c D density due to coherent spin pumping is $$j_s = \frac{\hbar g_s}{e^2}(\ell\times\dot{\ell} + m\times\dot{m}), \quad [16]$$

where l and m are the spatially-uniform Néel vector and the dimensionless magnetization vector, respectively. $g_s$ is the areal density of the interfacial spin-mixing conductance. In our experimental setup, only the DC component of $j_s$ along the z axis can be detected. Therefore, the coherent spin current density is $$j_s^{coh}(0^+) = \frac{\hbar g_s}{e^2}\hbar\omega_0\langle \hat{c}_{0\downarrow}^+\hat{c}_{0\downarrow}\rangle = \frac{\hbar^2 g_s}{e^2}\left(\frac{a^3}{V}\right)\frac{F}{\alpha+\eta}, \quad (S10)$$

where we have omitted the spin index in $J_s^{coh}$ for visual succinctness. Hereafter, positive (negative) sign corresponds to spin-down (spin-up) polarization.

For incoherent magnons, however, we need to take into account all possible modes in calculating the spin current density. The contribution from a particular mode labeled by wave vector k is $$j_\sigma(k) = \frac{\hbar g_s}{e^2}\hbar\omega_{k\sigma}\delta\langle \hat{c}_{k\sigma}^+\hat{c}_{k\sigma}\rangle_T, \quad [17]$$

where $$\delta\langle \hat{c}_{k\sigma}^+\hat{c}_{k\sigma}\rangle_T = \frac{\partial \bar{n}(\varepsilon_{k\sigma})}{\partial T}\Delta T$$

is the volume density of non-equilibrium incoherent magnons. Accordingly, the total incoherent spin current density is $$j_s^{incoh}(0^+) = -\frac{\hbar a^3 g_s}{e^2}\int\frac{d^3 k}{(2\pi)^3}\left[\varepsilon_{k\uparrow}\frac{\partial \bar{n}(\varepsilon_{k\uparrow})}{\partial T} - \varepsilon_{k\downarrow}\frac{\partial \bar{n}(\varepsilon_{k\downarrow})}{\partial T}\right]\Delta T(0^-), \quad (S11)$$

where $0^+(0^-)$ denotes the spatial vicinity on the metal (AFM) side of the interface (see Extended Data FIG. 8a). By invoking Eq. (S7), we can relate $\Delta T(0^-)$ to $n_{th}(0^-)$ as:

$$j^{incoh}(0^+) = -\frac{\hbar a^3 g_s k_B T}{e^2}\xi(T)n_{th}(0^-), \quad (S12)$$

where $\xi(T)$ is a non-analytical function converting total magnon density into spin current density:

$$\xi(T) = \frac{I_-(T) - I_+(T)}{n_-(T) + n_+(T)}, \quad (S13)$$

where $$I_\pm(T) = \int_{u_m \pm u_b}^\infty du \frac{u^2(u \mp u_b)\sqrt{(u \mp u_b)^2 - u_m^2}\, e^u}{(e^u - 1)^2},$$

$$n_\pm(T) = \int_{u_m \pm u_b}^\infty du \frac{u(u \mp u_b)\sqrt{(u \mp u_b)^2 - u_m^2}\, e^u}{(e^u - 1)^2},$$

with $u_b = \gamma B / k_B T$ and $u_m = \hbar \omega_m / k_B T$. As shown in Extended Data FIG. 8b, for T>2.3 K, $\xi(T)$ can be well fitted as $$\xi(T) \sim \frac{1}{T^{1.05}}.$$

The pattern of $\xi(T)$ indicates that the spin polarization of thermal magnons decays with temperature.

Now the calculation of $j_s^{incoh}(0^+)$ boils down to determining $\xi(0^-)$, which is the steady-state solution of Eq. (S9) at $x \to 0^-$. When $$\frac{\partial n_{th}}{\partial t} = 0,$$

Eq. (S9) reduces to $$\frac{\partial^2 n_{th}}{\partial x^2} = \frac{n_{th}}{\lambda^2} - \frac{\eta \omega_0 N_\theta}{D}$$

with $\lambda = \sqrt{D\tau_p}$ being the magnon spin diffusion length. As illustrated in Extended Data FIG. 8a, the boundary conditions are $$j(-d) = -\hbar D \frac{\partial n_{tb}}{\partial x}\bigg|_{-d} = 0 \text{ and } \left(\frac{\partial n_{th}}{\partial x} + \frac{\xi a^3 g_s k_B T}{De^2} n_{th}\right)\bigg|_{0^-} = 0,$$

where the latter entails the continuity of spin current density across the AFM/HM interface. Then, the density of incoherent magnons arriving at the interface can be solved as $$n_{th}(0^-) = \frac{\eta F \tau_p}{V(\alpha + \eta)\left[1 + \frac{\xi a^3 g_s k_B T \lambda}{De^2} \coth\frac{d}{\lambda}\right]}. \quad (S14)$$

Since $d \gg \lambda$, $\coth d/\lambda \approx 1$. With typical material parameters, the front factor of the coth $d/\lambda$ term is of order 0.01 to 0.1, thus $$Vn_{th}(0^-) \approx \frac{F\tau_p}{1 + \frac{\alpha}{\eta}}.$$

For AFM thin films, however, $d \ll \lambda$, so coth $d/\lambda$ can be appreciably large and $n_{th}(0^-)$ can be much smaller than its bulk value. That is to say, replacing the bulk AFM with an AFM thin film can considerably suppress the incoherent contribution, which will be explored in the future.

Combining Eqs. (S10), (S12) and (S14), we finally obtain the total spin current density injected into the HM $$j_s^{tot} = j_s^{coh}(0^+) + j_s^{incoh}(0^+) = \frac{F}{\alpha}\frac{a^3}{V}\frac{\hbar^2 g_{\uparrow\downarrow}}{e^2}\frac{1}{1+\frac{\eta}{\alpha}}\left[1 - \eta \xi(T)\frac{\tau_p k_B T}{\hbar}\right], \quad (S15)$$

which will be used to fit the experimental data.

Data fitting: In Eq. (S15), the term proportional to $\xi(T)$ represents the incoherent contribution, which has a complicated temperature dependence: $\eta$, $\xi(T)$, $\tau_p$ are all temperature dependent. Although we do not know the specific forms of $\eta(T)$ and $\tau_p(T)$ for $Cr_2O_3$, an empirical conjecture is that they all scale with T in power laws. We further assume that the Gilbert damping $\alpha$ only weakly depends on T, so the pre-factor of Eq. (S15) is essentially T-independent. Therefore, we can take $$\frac{\eta}{\alpha} = AT^a \text{ and } \eta \xi \frac{\tau_p k_B T}{\hbar} = BT^b,$$

where A, B, a and b are phenomenological constants to be determined by fitting with the experimental data. Under these considerations, $j_s^{tot}$, hence $V_{ISHE}$, conform with the function:

$$V_{ISHE} \propto j_s^{tot} \propto \frac{1 - BT^b}{1 + AT^a}, \quad (S16)$$

where we have omitted an unimportant overall factor involving multiplicative factors such as the spin Hall angle, the bulk resistance of the detecting metals, etc. The 1 and $BT^b$ terms in the numerator reflect the competing coherent and incoherent contributions, respectively; they share a common denominator containing the coherent-to-incoherent magnon production rate $AT^a$. As shown in FIG. 3c, those parameters are fitted to be a=5.247, b=−0.009, A=4.062×10⁻¹⁰, and B=1.034. The fitted curve agrees with the experimental data very well (the adjusted coefficient of determination is 0.981, very close to 1).

The analysis of QFMR is quite similar. The only difference is that both coherent and incoherent magnons have spin-down polarization (RH chirality). Therefore, the phenomenological form of the spin current density arising from QFMR, hence the subsequent ISHE voltage, is $$V_{ISHE}^{QF} \propto j_s^{QF} \propto \frac{1 + BT^b}{1 + AT^a}. \quad (S17)$$

As shown in FIG. 3d, the fitted phenomenological parameters are a=0.719, b=−1.168, A=0.145, and B=90.563. The fitted curve, again, agrees with the experimental data very well (the adjusted coefficient of determination is 0.994, very close to 1).

Using the fitted values of the phenomenological parameters, Eq. (S16) diverges at T→0. This unphysical divergence pertains to the implicit assumption of our theory: thermalization of magnons is much faster than the microwave frequency so that a quasi-equilibrium distribution of thermal magnons can be maintained at any instant of time, which holds for the temperature regime (T>5 K) of our experiment. However, when T gets lower and lower, this condition becomes increasingly problematic. At extremely low temperatures, magnons are not able to thermalize and adjust to the time-varying microwave drive, which invalidates our theory. Clearly, the lowest temperature point (~5 K) in FIG. 3 has not yet touched that regime.

REFERENCES

1. Gomonay, O., Baltz, V., Brataas, A. & Tserkovnyak, Y. Antiferromagnetic spin textures and dynamics. Nat. Phys. 14, 213-216 (2018).
2. Kampfrath, T. et al. Coherent terahertz control of antiferromagnetic spin waves. Nat. Photon. 5, 31-34 (2011).
3. Tzschaschel, C. et al. Ultrafast optical excitation of coherent magnons in antiferromagnetic NiO. Phys. Rev. B 95, 174407 (2017).
4. Cheng, R., Xiao, J., Niu, Q. & Brataas, A. Spin pumping and spin-transfer torques in antiferromagnets. Phys. Rev. Lett. 113, 057601 (2014).
5. Johansen, O. & Brataas, A. Spin pumping and inverse spin Hall voltages from dynamical antiferromagnets. Phys. Rev. B 95, 220408(R) (2017).
6. Ross, P., Schreier, M., Lotze, J., Huebl, H., Gross, R. & Goennenwein, S. T. B. Antiferromagentic resonance detected by direct current voltages in $MnF_2$/Pt bilayers. J. Appl. Phys. 118, 233907 (2015).
7. Hofmann, A. Spin Hall effects in metals. IEEE Trans. Magn. 49, 5172-5193 (2013).
8. Sinova, J. et al. Spin Hall effects. Rev. Mod. Phys. 87, 1213-1259 (2015).
9. Li, J. et al. Observation of magnon-mediated current drag in Pt/yttrium iron garnet/Pt($T^a$) trilayers. Nat. Commun. 7, 10858 (2016).
10. Marti, X. et al. Room-temperature antiferromagnetic memory resistor. Nat. Mater. 13, 367-374 (2014).
11. Wadley, P. et al. Electrical switching of an antiferromagnet. Science 351, 587-591 (2016).
12. Kriegner, D. et al. Multiple-stable anisotropic magnetoresistance memory in antiferromagnetic MnTe. Nat. Commun. 7, 11623 (2016).
13. Kittel, C. Theory of antiferromagnetic resonance. Phys. Rev. 82, 565 (1951).
14. Kefer, F. & Kittel, C. Theory of antiferromagnetic resonance. Phys. Rev. 85, 329-337 (1952).
15. Němec, P., Fiebig, M., Kampfrath, T. & Kimel, A. V. Antiferromagnetic opto-spintronics. Nat. Phys. 14, 229-241 (2018).
16. Baltz, V. et al. Antiferromagnetic spintronics. Rev. Mod. Phys. 90, 015005 (2018).
17. He, X. et al. Robust isothermal electric control of exchange bias at room temperature. Nature Mater. 9, 579-585 (2010).
18. Dayhoff, E. S. Antiferromagnetic Resonance in $Cr_2O_3$. Phys. Rev. 107, 84 (1957).
19. Foner, S. High-field antiferromagnetic resonance in $Cr_2O_3$. Phys. Rev. 130, 183-197 (1963).
20. Takahashi, S. et al. Pulsed electron paramagnetic resonance spectroscopy powered by a free-electron laser. Nature (London) 489, 409 (2012).
21. Edwards, D. T., Zhang, Y., Glaser, S. J., Han, S. & Sherwin, M. S. Phase cycling with a 240 GHz, free electron laser-powered electron paramagnetic resonance spectrometer. Phys. Chem. Chem. Phys. 15, 5707 (2013).
22. Bogdanov, A. N., Zhuravlev, A. V. & Robler, U. K. Spin-flop transition in uniaxial antiferromagnets: magnetic phases, reorientation effects, and multidomain states. Phys. Rev. B 75, 094425 (2007).
23. Lin, W. W. & Chien, C. L. Evidence of pure spin current. arXiv:1804.01392 (2018).
24. Chen, Y. S., Lin, J. G., Huang, S. Y. & Chien, C. L. Incoherent spin pumping from YIG single crystals. Phys. Rev. B 99, 220402(R) (2019).
25. Seki, S. et al. Thermal generation of spin current in an antiferromagnet. Phys. Rev. Lett. 115, 266601 (2015).
26. Geprags, S. et al. Origin of the spin Seebeck effect in compensated ferrimagnets. Nat. Commun. 7, 10452 (2016).
27. Cramer, J. et al. Magnon mode selective spin transport in compensated ferrimagnets. Nano Lett. 17, 3334 (2017).
28. Rezende, S. M., Rodriguez-Suarez, R. L. & Azevedo, A. Theory of the spin Seebeck effect in antiferromagnets. Phys. Rev. B 93, 014425 (2016).
29. Wu, S. M. et al. Antiferromagnetic spin Seebeck effect. Phys. Rev. Lett. 116, 097204 (2016).
30. Li, J. et al. Spin Seebeck Effect from Antiferromagnetic Magnons and Critical Spin Fluctuations in Epitaxial $FeF_2$ Films. Phys. Rev. Lett. 122, 217204 (2019).

The invention claimed is:
1. A electromagnetic radiation detector, comprising:
a first layer including an antiferromagnetic material (AFM);
a second layer, in contact with the first layer, the second layer including a heavy metal (HM);
a third layer opposite the second layer and in contact with the first layer, the third layer configured to generate an effective field having a direction oriented approximately parallel to an easy axis of a crystal lattice of the antiferromagnetic material and to a direction of propagation of incident electromagnetic radiation; and
an electrical circuit in electrical communication with the second layer;
wherein the first layer is configured to inject a spin current into the second layer in response to receipt of electromagnetic radiation having a frequency within the range of sub-terahertz or terahertz frequencies;
wherein the second layer is configured to generate a potential difference in response to receipt of the spin current; and
wherein the circuit is configured to output an electrical signal corresponding to the potential difference.
2. The detector of claim 1, wherein the second layer includes a topological insulator.
3. The detector of claim 1, further comprising a waveguide configured to guide the received electromagnetic radiation for incidence upon the first layer and the second layer.
4. The detector of claim 1, wherein the third layer includes a ferromagnetic material.
5. The detector of claim 1, wherein the second layer includes a metal or metal alloy having a spin Hall angle between 0.1 and 0.35.
6. The detector of claim 5, wherein the metal includes at least one of platinum, tungsten, bismuth, or tantalum or the metal alloy includes gold and platinum.
7. The detector of claim 1, wherein the electromagnetic radiation received at the first layer includes circular or elliptical polarization.

8. The detector of claim 1, wherein the first layer is strained to a predetermined level by introducing a residual stress via lattice mismatch with a substrate upon which the first layer is formed.

9. The detector of claim 8, wherein the predetermined level changes the frequency within the range of sub-terahertz or terahertz frequencies at which the first layer injects spin current into the second layer as compared to the first layer in an unstrained state.

10. The detector of claim 9, wherein the predetermined level is associated with a desired filter range of the frequency within the range of sub-terahertz or terahertz frequencies at which the first layer injects spin current into the second layer.

11. A method of detecting electromagnetic radiation, comprising:
  receiving electromagnetic radiation having a frequency within the range of sub-terahertz or terahertz frequencies by an electromagnetic radiation detector, wherein the electromagnetic radiation detector includes a first layer of an antiferromagnetic material (AFM), a second layer in contact with the first layer and including a heavy metal (HM), and a third layer opposite the second layer and in contact with the first layer;
  generating an effective field having a direction oriented approximately parallel to an easy axis of a crystal lattice of the antiferromagnetic material and to a direction of propagation of the received electromagnetic radiation; and
  generating, within the first layer, a spin current in response to receipt of the electromagnetic radiation;
  receiving, by the second layer, the spin current;
  generating, within the second layer, a potential difference in response to receipt of the spin current; and
  outputting, by an electrical circuit in electrical communication with the second layer, an electrical signal corresponding to the potential difference.

12. The method of claim 11, wherein the second layer includes a topological insulator.

13. The method of claim 11, wherein the electromagnetic radiation detector further comprises a waveguide configured to guide the received electromagnetic radiation for incidence upon the first layer and the second layer.

14. The method of claim 11, wherein the third layer includes a ferromagnetic material.

15. The method of claim 11, wherein the second layer includes a metal or a metal alloy having a spin Hall angle between 0.1 and 0.35.

16. The method of claim 15, wherein the metal includes at least one of platinum, tungsten, bismuth, or tantalum or the metal alloy includes gold and platinum.

17. The method of claim 11, wherein the electromagnetic radiation received at the first layer includes circular or elliptical polarization.

18. The method of claim 11, wherein the first layer is strained to a predetermined level by introducing a residual stress via lattice mismatch with a substrate upon which the first layer is formed.

19. The method of claim 18, wherein the predetermined level changes the frequency within the range of sub-terahertz or terahertz frequencies at which the first layer injects spin current into the second layer as compared to the first layer in an unstrained state.

20. The method of claim 19, wherein the predetermined level is associated with a desired filter range of the frequency within the range of sub-terahertz or terahertz frequencies at which the first layer injects spin current into the second layer.

* * * * *